(12) United States Patent
Lazzarino et al.

(10) Patent No.: US 11,710,637 B2
(45) Date of Patent: Jul. 25, 2023

(54) PATTERNING METHOD

(71) Applicant: IMEC VZW, Leuven (BE)

(72) Inventors: Frederic Lazzarino, Hamme-Mille (BE); Victor M. Blanco, Leefdaal (BE)

(73) Assignee: Imec VZW, Leuven (BE)

( * ) Notice: Subject to any disclaimer, the term of this patent is extended or adjusted under 35 U.S.C. 154(b) by 219 days.

(21) Appl. No.: 17/238,111

(22) Filed: Apr. 22, 2021

(65) Prior Publication Data
US 2021/0335611 A1    Oct. 28, 2021

(30) Foreign Application Priority Data

Apr. 23, 2020    (EP) .................................... 20171072

(51) Int. Cl.
*H01L 21/033*    (2006.01)
*H01L 21/768*    (2006.01)

(52) U.S. Cl.
CPC ...... *H01L 21/0338* (2013.01); *H01L 21/0335* (2013.01); *H01L 21/0337* (2013.01); *H01L 21/76816* (2013.01); *H01L 21/76877* (2013.01)

(58) Field of Classification Search
CPC ............ H01L 21/0334; H01L 21/0335; H01L 21/0337; H01L 21/0338; H01L 21/76816; H01L 21/76877; H01L 21/0274
See application file for complete search history.

(56) References Cited

U.S. PATENT DOCUMENTS

| | | | |
|---|---|---|---|
| 9,818,641 B1 | 11/2017 | Bouche et al. | |
| 2018/0061658 A1* | 3/2018 | Mohanty | ........... H01L 21/31053 |
| 2018/0261497 A1 | 9/2018 | Drissi et al. | |

FOREIGN PATENT DOCUMENTS

EP    3618103 A1    3/2020

OTHER PUBLICATIONS

Extended European Search Report and Written Opinion, European Application No. 20171072.0, dated Oct. 16, 2020, 8 pages.

* cited by examiner

*Primary Examiner* — Walter H Swanson
(74) *Attorney, Agent, or Firm* — McDonnell Boehnen Hulbert & Berghoff LLP

(57) ABSTRACT

A method that provides patterning of an underlying layer to form a first set of trenches and a second set of trenches in the underlying layer is based on a combination of two litho-etch (LE) patterning processes supplemented with a spacer-assisted (SA) technique. The method uses a layer stack comprising three memorization layers: an upper memorization layer allowing first memorizing upper trenches, and then one or more upper blocks; an intermediate memorization layer allowing first memorizing intermediate trenches and one or more first intermediate blocks, and then second intermediate blocks and intermediate lines; and a lower memorization layer allowing first memorizing first lower trenches and one or more first lower blocks, and then second lower trenches and one or more second lower blocks.

20 Claims, 29 Drawing Sheets

US 11,710,637 B2

PATTERNING METHOD

CROSS-REFERENCE TO RELATED APPLICATIONS

The present application is a non-provisional patent application claiming priority to European Patent Application No. 20171072.0, filed Apr. 23, 2020, the contents of which are hereby incorporated by reference.

FIELD OF THE DISCLOSURE

This application relates to a patterning method.

BACKGROUND

Lithography and etching processes ("litho-etch") are frequently used in semiconductor device fabrication, for instance, to form trenches, openings, or other patterns in, e.g., a hard mask layer, a dielectric layer, a metal layer, or a semiconductor layer. A pattern such as a trench pattern may be lithographically defined (i.e., exposed and developed) in a resist layer and transferred into an underlying layer by etching. The minimum critical dimensions (CDs) of litho-etch based patterning is dependent on the wavelength of the light used for exposing resist. Hence, extreme ultraviolet lithography (EUVL) facilitates patterns with reduced CDs compared to current technologies based on, for instance, 193i.

In spacer-assisted multiple patterning techniques (also known as self-aligned multiple patterning techniques) such as SADP or SAQP, grating-like patterning layers of mandrel lines and spacer lines may be used to form sub-lithographic tight pitch line patterns in an underlying layer. Multiple patterning may be combined with block techniques to facilitate forming of interrupted or discontinuous lines.

EP 3618103 discloses a patterning method based on a combination of two litho-etch processes supplemented with a spacer-assisted (SA) technique. The method may hence be referred to as a "SALELE" patterning process. The two LE processes allow two alternating sets of trenches to be patterned in a target layer. Employing two LE processes allows comparably tight pitch patterns to be formed by combining two relaxed pitch patterns. Meanwhile, the addition of the spacer-assisted technique makes it possible to ensure at least minimum separation between adjacent trenches in the target layer. Forming of interrupted trenches with small tip-to-tip separation is facilitated through the use of block patterns.

Although state of the art patterning methods offers a path towards increasingly aggressive target CDs, more aggressive target CDs imply an increasing sensitivity towards process variability, notably a sensitivity to edge placement errors (EPE).

SUMMARY

In light of the above, an aspect of the application provides a patterning method that facilitates forming trench patterns that comprise interrupted trenches, with a reduced sensitivity to process variability, and in particular, having an improved EPE margin. Further and alternative aspects may be understood from the following.

According to a first aspect, a patterning method comprises:

forming over an underlying layer a layer stack comprising a lower, an intermediate, and an upper memorization layer;

patterning the upper memorization layer using lithography and etching to form upper trenches in the upper memorization layer;

forming sidewall spacer lines along sidewalls of the upper trenches;

forming first mask blocks, each first mask block forming a trench interruption along a respective upper trench;

patterning the intermediate memorization layer and the lower memorization layer to form intermediate trenches in the intermediate memorization layer and first lower trenches in the lower memorization layer.

The patterning comprising etching while the patterned upper memorization layer, the sidewall spacer lines, and the first mask blocks mask the intermediate memorization layer, wherein at least a subset of the intermediate trenches are interrupted by a respective first intermediate block formed of a respective first intermediate memorization layer portion masked by a respective first mask block (during etching of the intermediate memorization layer), and wherein at least a subset of the first lower trenches are interrupted by a respective first lower block formed of a respective first lower memorization layer portion masked by a respective first intermediate block (during etching of the lower memorization layer).

The first aspect further comprises, while a deposited mask material is filling the upper, the intermediate, and the first lower trenches:

patterning the patterned upper memorization layer using lithography and etching to form upper blocks of remaining upper memorization layer portions, and patterning the patterned intermediate memorization layer to form second intermediate blocks and intermediate lines, the patterning comprising etching the patterned intermediate memorization layer while the spacer lines and the upper blocks mask the patterned intermediate memorization layer, and while the deposited mask material masks the first intermediate blocks. The second intermediate blocks are formed of intermediate memorization layer portions masked by the upper blocks during the etching of the patterned intermediate memorization layer. The intermediate lines are formed by intermediate memorization layer portions masked by the spacer lines during the etching of the patterned intermediate memorization layer.

The first aspect further comprises (subsequent to the patterning of the patterned upper memorization layer and the patterned intermediate memorization layer) patterning the patterned lower memorization layer to form second lower trenches in the patterned lower memorization layer.

The patterning of the patterned lower memorization layer comprises:

forming an auxiliary trench mask stack over the lower memorization layer and patterning auxiliary trenches therein by lithography and etching, and etching the patterned lower memorization layer, while the patterned auxiliary trench mask stack, the second intermediate blocks, and the intermediate lines mask the patterned lower memorization layer, and the first intermediate blocks mask the first lower blocks, wherein at least a subset of the second lower trenches are interrupted by a respective second lower block formed of a respective second lower memorization layer portion masked by a respective second intermediate block during the etching of the patterned lower memorization layer.

The first aspect further comprises patterning in the underlying layer a first set of trenches underneath the first lower trenches and a second set of trenches underneath the second lower trenches.

The method allows patterning of the underlying layer to form a first set of trenches and a second set of trenches in the underlying layer. The method is based on a combination of two litho-etch (LE) patterning processes supplemented with a spacer-assisted (SA) technique. Accordingly, the method may be referred to as a "SALELE" patterning process and confers aspects corresponding to those of the aforementioned SALELE process. Among others, the method facilitates increased flexibility for the shape of the trench patterns compared to conventional SADP and SAQP techniques. Additionally, the method facilitates forming of trench patterns with smaller CDs than provided by conventional pure lithographical patterning techniques.

Furthermore, employing LE processes for patterning the upper trenches and for patterning the second lower trenches allows comparably tight pitch patterns to be formed by combining two relaxed pitch patterns. In an example, these processes may be utilized in combination with EUVL, which otherwise is a technique prone to stochastic failures if used to directly form aggressively scaled patterns. Relaxed printing may provide corresponding aspects also in 193i applications.

The method uses a layer stack comprising three memorization layers: A lower memorization layer over (e.g., on) the underlying layer in which the first and second sets of trenches are to be formed, an intermediate memorization layer over (e.g., on) the lower memorization layer, and an upper memorization layer over (e.g., on) the intermediate memorization layer. Each one of the lower, intermediate, and upper memorization layers is provided for memorizing a (respective) pattern. As the method proceeds, each memorization layer is used more than once to facilitate the trench formation in the underlying layer. The upper memorization layer allows first memorizing upper trenches, and then upper blocks. Since the upper blocks are formed by patterning the already patterned upper memorization layer, the upper blocks may be self-aligned with respect to the first set of lower trenches and consequently reliably be aligned with the second set of lower trenches. The intermediate memorization layer allows first memorizing intermediate trenches and one or more first intermediate blocks, and then second intermediate blocks and intermediate lines. The lower memorization layer allows first memorizing first lower trenches and one or more first lower blocks, and then second lower trenches and one or more second lower blocks.

The use of blocks (e.g., the first mask blocks and the upper blocks) to define trench interruptions facilitate forming of interrupted trenches with smaller tip-to-tip separation than would be achievable by directly "printing" lithography-defined interrupted trenches into the memorization layers.

Moreover, the method confers the above-discussed aspects in conjunction with allowing a reduced sensitivity to process variability, in particular an improved margin against EPE during the patterning of the second lower trenches.

The improved margin is facilitated, at least in part, by the intermediate memorization layer present between the lower and upper memorization layers. The intermediate memorization layer allows the trench interruptions along the upper trenches, as defined by the first mask blocks, to be memorized as first intermediate blocks and first lower blocks underneath the first intermediate blocks. These "two-tone" comprising blocks (i.e., the first lower blocks underneath the first intermediate blocks representing two different tones) provide masking of the first lower blocks by the first intermediate blocks during the patterning of second lower trenches (in the already patterned lower memorization layer). Hence, even if an auxiliary trench in the auxiliary trench mask stack extends above/overlaps a first intermediate block and a first lower block in a first intermediate trench and a first lower trench, respectively, the first intermediate block may counteract etching of the first lower block. Hence, trench interruptions of the first lower trenches, memorized as the first lower blocks, may also be preserved following the second lower trench formation.

Depositing a mask material filling the upper, the intermediate, and the first lower trenches prior to patterning the patterned intermediate memorization layer allows the first intermediate blocks to be masked and thus preserved until the subsequent patterning of the patterned lower memorization layer. That is, the mask material may counteract etching of the first intermediate blocks during the patterning of the patterned intermediate memorization layer.

Moreover, according to the method, the sidewall spacer lines are present at least during the patterning of the intermediate memorization layer, the lower memorization layer, the patterned upper memorization layer, and the patterned intermediate memorization layer, and also during the patterning of the patterned lower memorization layer.

The presence of the sidewall spacer lines makes it possible to ensure at least minimum separation between the first lower trenches and the second lower trenches. Hence, if an auxiliary trench in the auxiliary trench mask stack (by design or due to an EPE) extends above/overlaps a first lower trench, the spacer line portion extending along the exposed first lower trench may mask (and hence counteract etching of) a lower memorization layer portion underneath the spacer line portion. Thus, a second lower trench may be etched in the lower memorization layer, through the overlapping auxiliary trench, while the spacer line portion ensures that the first lower trench and the second lower trench are separated by the masked lower memorization layer portion, e.g., having a width determined by a linewidth of the spacer line.

The presence of the spacer lines during the patterning of the patterned intermediate memorization layer allows forming of the intermediate lines. Hence, as may be appreciated, the intermediate lines may provide a corresponding function as the spacer lines during the patterning of the patterned lower memorization layer if the spacer lines are removed prior thereto.

As may be appreciated from the above discussion of the first aspect, the lower, intermediate, and upper memorization layers represent different layers of the layer stack, each formed of a respective material. At least the intermediate memorization layer is formed of a material (hereinafter "intermediate layer material") which is different from a material of the lower memorization layer ("lower layer material") and a material of the upper memorization layer ("upper layer material"). Additionally, the lower layer material and the upper layer material may be different materials. For example, the lower layer material may be a dielectric material such as an oxide, a nitride, or a carbide. The intermediate layer material may be a metal-comprising material such as a metal nitride, a metal carbide, or a metal oxide. The upper layer material may be amorphous silicon (aSi).

The underlying layer below the layer stack represents a layer different from the memorization layers of the layer stack. The underlying layer may be formed of a material ("underlying layer material") that is different from at least the lower layer material. As will be further described below, the underlying layer may also be a memorization layer (i.e., a "target memorization layer"). The underlying/target layer material may, for example, be formed of any of the materials discussed in connection with the intermediate layer material.

The sidewall spacer lines may be formed of a material ("spacer material") that is different from each one of the upper, intermediate, and lower layer materials, and also different from the underlying layer material. The sidewall spacer lines (for brevity "spacer lines") may be formed of typical spacer materials, such as an atomic layer deposition (ALD) deposited oxide or nitride (different from the lower, intermediate, or upper layer material).

The deposited mask material filling the upper, the intermediate, and the first lower trenches during the patterning of the patterned upper and intermediate memorization layers may generally be formed of a material different from at least the upper layer material and intermediate layer material. The deposited mask material may comprise an organic spin-on material, such as spin-on-carbon (SOC).

The different memorization layers (of the respective materials) allow providing an etch contrast during the various layer-patterning steps of the first method aspect. In other words, during patterning of a first layer of a first material (such as the intermediate memorization layer) to form trenches therein, and/or blocks thereof, the first layer may be etched at a greater rate than a second layer or feature of a second material also exposed to the etching process during the patterning. Thereby, the first material (of the first layer) may be selectively etched or removed, i.e., removed at a greater rate than the second material (of the second layer or feature).

A first feature masking a second feature during etching implies that the first feature is located above the second feature (or conversely, the second feature is located underneath the first feature) such that the first feature may act as an etch mask and accordingly counteract etching of the second feature.

That a first feature masks a second feature implies that the second feature is masked by at least the first feature, and possibly also other features, intermediate the first and second features, or above the first features. In other words, the first feature may act as an etch mask for the second feature, possibly together with other intermediate or above features.

Accordingly, the patterning of the intermediate memorization layer may comprise etching the intermediate memorization layer while the patterned upper memorization layer, the sidewall spacer lines, and the first mask blocks act as an etch mask. The intermediate memorization layer may be etched at a greater rate than the patterned upper memorization layer, the sidewall spacer lines, and the first mask blocks.

The patterning of the lower memorization layer may comprise etching the lower memorization layer while the patterned upper memorization layer, the sidewall spacer lines, and the first mask blocks (or the first intermediate blocks if the first mask blocks have been removed) act as an etch mask. The lower memorization layer may be etched at a greater rate than the patterned upper memorization layer, the sidewall spacer lines, and the first mask blocks (and then the first intermediate blocks if the first mask blocks have been removed).

The patterning of the patterned intermediate memorization layer may comprise etching the patterned intermediate memorization layer while the upper blocks, the spacer lines, and the mask material act as an etch mask. The patterned intermediate memorization layer may be etched at a greater rate than the upper blocks, the spacer lines, and the mask material.

The patterning of the patterned lower memorization layer may comprise etching the patterned lower memorization layer while the patterned auxiliary trench mask stack, the upper blocks (or the second intermediate blocks if the upper blocks have been removed), the spacer lines (or the intermediate lines if the spacer lines have been removed), and the first intermediate blocks act as an etch mask. The patterned lower memorization layer may be etched at a greater rate than the patterned auxiliary trench mask stack (e.g., mask material thereof), the upper blocks (or the second intermediate blocks if the upper blocks have been removed), the spacer lines (or the intermediate lines if the spacer lines have been removed), and the first intermediate blocks.

The first and second set of trenches may be patterned simultaneously in the underlying layer. The first and second set of trenches may alternatively be patterned sequentially. That is, the first set of trenches may be patterned in the underlying layer prior to the second set of trenches. A simultaneous approach may allow reducing the number of times a layer below the underlying layer (such as an insulating layer) is exposed to etchants.

The spacer lines may be formed using a sidewall spacer formation process comprising etching back a conformally deposited spacer layer. For example, a spacer layer may be conformally deposited (e.g., by ALD) to cover the patterned upper memorization layer, the sidewalls, and bottom surfaces of the upper trenches. The spacer layer may subsequently be subjected to an anisotropic etch (e.g., a vertically biased dry etch) adapted to remove spacer layer portions from horizontally oriented surfaces comprising upper surfaces of the patterned upper memorization layer, and bottom surfaces of the upper trenches, such that spacer layer portions remain on the upper trench sidewalls to form the spacer lines. A sidewall spacer formation process allows spacer lines to be reliably formed with uniform a linewidth/thickness, thereby contributing to reduced process variability.

The first mask blocks may be removed subsequent to patterning the intermediate memorization layer and the lower memorization layer, and prior to filling the first lower trenches, the (first) intermediate trenches and (first) upper trenches with the mask material. This may provide an increased etch margin since the first intermediate blocks may be masked during the patterning of the lower memorization layer. Removing the first mask blocks prior to filling the trenches with the mask material allows topography variations to be reduced for the subsequent patterning steps. However, it is also possible to remove the first mask blocks prior to patterning the lower memorization layer.

The method may further comprise, subsequent to forming the first lower trenches, forming an auxiliary block mask stack comprising mask material filling the upper, the intermediate, and the first lower trenches, and a resist layer.

The patterning of the patterned upper memorization layer may comprise first patterning the auxiliary block mask stack to form auxiliary blocks using lithography and etching and then patterning the patterned upper memorization layer using the patterned auxiliary block mask stack to form the upper blocks.

The patterned upper memorization layer may accordingly be masked by the auxiliary blocks during the etching. Upper blocks may thereby be formed by upper memorization layer portions masked by the auxiliary blocks. The mask material of the auxiliary block mask stack may fill the upper, intermediate, and lower trenches and thus cover the first lower and first intermediate blocks. The mask material may be a single deposited mask material layer or a stack of two or more deposited mask material layers. The mask material may be different from the upper layer material, the spacer material, and the intermediate layer material. The mask material may be deposited to form a planarizing mask material layer filling the trenches and covering the patterned upper memorization layer. The mask material may be an organic spin-on material, such as SOC.

The auxiliary trench mask stack may comprise mask material that forms a planarizing layer covering the upper blocks, the spacer lines, and the patterned lower memorization layer. The auxiliary trench mask stack may further comprise a resist layer over the mask material. The mask material may be a single deposited mask material layer or a stack of two or more deposited mask material layers. The mask material may be different from at least the spacer material and the intermediate layer material, and also different from the upper layer material. The mask material may be an organic spin-on material, such as SOC.

The auxiliary trenches may be formed to expose upper surface portions of the lower memorization layer between the first lower trenches. The patterning of the patterned lower memorization layer may comprise etching the second lower trenches in the lower memorization layer through the auxiliary trenches.

At least one auxiliary trench of the auxiliary trench mask stack may extend above a first lower trench and a first intermediate block above a first lower block located in the first lower trench. Hence, at least one auxiliary trench may expose the first intermediate block. Due to the presence of the first intermediate block, the patterned lower memorization layer may, however, still be etched to form the second lower trenches without removing the earlier memorized trench interruption of the first lower trench (i.e., the first lower block therein). Moreover, the presence of the spacer layer makes it possible to ensure that the second lower trenches are separated from the first lower trenches.

Trenches of at least a subset of the second lower trenches may be arranged alternatingly with trenches of at least a subset of the first set of lower trenches. That is, among the trenches of these subsets, a second lower trench may be formed between a pair of first lower trenches, and vice versa.

Each trench of the aforementioned subset of second lower trenches may be spaced from an adjacent trench of the aforementioned at least a subset of the first lower trenches by (e.g., only) a respective lower line formed of a respective third lower memorization layer portion masked by a respective intermediate line. Hence, a minimum separation between the first and second lower trenches may be determined by a line width of the spacer lines.

The patterning method of the first aspect may be used in conjunction with a method for forming an interconnection structure. Hence, according to a second aspect, there is provided a method for forming an interconnection structure, comprising:
  forming over an insulating layer a target memorization layer;
  forming a first and a second set of trenches in the target memorization layer in accordance with a method according to the first aspect, wherein the underlying layer is the target memorization layer;
  subsequent to forming the first and second set of trenches in the target memorization layer, etching first trenches in the insulating layer, underneath the first set of trenches in the target memorization layer, and second trenches in the insulating layer, underneath the second set of trenches in the target memorization layer, while the target memorization layer masks the insulating layer; and
  depositing a conductive material in the trenches in the insulating layer.

The method of the second aspect may further comprise, subsequent to the patterning of the intermediate and lower memorization layers and prior to the patterning of the patterned upper memorization layer:
  forming a via hole etch stack comprising a mask material filling the upper, the intermediate, and first lower trenches, and further comprising a resist layer,
  forming an opening in the via hole etch stack, the opening exposing an upper surface of a remaining portion of the patterned upper memorization layer,
  etching back the exposed upper surface of the patterned upper memorization layer to form an opening in the patterned upper memorization layer, and
  sequentially etching back the patterned intermediate, patterned lower, and target memorization layers through the opening in the patterned upper memorization layer to form an extended opening therethrough;

The method further comprises etching the insulating layer through the extended opening.

Thereby, a (second) via opening or via hole may be formed in the insulating layer. The via opening may, because of the patterning method, be self-aligned with the second set of trenches in the target memorization layer and consequently also with respect to the second trenches in the insulating layer.

The insulating layer may first be etched through the extended opening to form a preliminary via opening, which subsequently may be deepened during the aforementioned etching of (second) trenches in the insulating layer, thereby forming a final via opening.

The conductive material may be deposited to fill both the (final) via opening and the trenches in the insulating layer.

The mask material of the via hole etch stack may be a single deposited mask material layer or a stack of two or more deposited mask material layers. The mask material may be different from the upper layer material, the spacer material, and the intermediate layer material. The mask material may further be different from one or more of the lower layer material, the target material layer, and a material of the insulating layer. The mask material may be deposited to form a planarizing mask material layer filling the trenches and covering the patterned upper memorization layer. The mask material may be an organic spin-on material, such as SOC.

The etch back of the exposed upper surface of the patterned upper memorization layer may be performed using an etching process adapted to etch the patterned upper memorization layer at a greater rate than the mask material filling the upper trenches, and/or at a greater rate than the spacer material. This facilitates an improved etch margin during the subsequent sequential etch back of the memorization layers.

The exposed upper surface of the upper memorization layer may be located between a pair of upper trenches, and wherein a width of the opening in the via hole etch stack may exceed a spacing between the pair of upper trenches. This facilitates a relaxed printing of the opening in the via hole etch stack.

The method may further comprise, subsequent to the patterning of the intermediate and lower memorization layers and prior to the patterning of the patterned upper memorization layer:

forming a via hole etch stack comprising mask material filling the lower, the intermediate, and the upper trenches, and further comprising a resist layer, forming an opening in the via hole etch stack, the opening exposing a bottom surface of a selected first lower trench, the opening exposing spacer layer portions on opposite sides of the selected first lower trench, etching back the exposed bottom surface to form an opening in the target memorization layer;

The method further comprises etching the insulating layer through the opening in the target memorization layer.

Thereby, a (first) via opening or via hole may be formed in the insulating layer. The via opening may, because of the patterning method, be self-aligned with the first set of trenches in the target memorization layer and consequently also with respect to the first trenches in the insulating layer.

The insulating layer may first be etched through the opening to form a preliminary via opening, which subsequently may be deepened during the aforementioned etching of (first) trenches in the insulating layer, thereby forming a final via opening.

The insulating layer may be etched through the opening immediately following the forming of the opening in the target memorization layer. However, if a second via opening is also to be formed as discussed above, it is also possible to perform the etching of the insulating layer through the opening in the target memorization layer (to form the first via opening) and through the extended opening (to form the second via opening) simultaneously.

The conductive material may be deposited to fill both the (final) via opening and the trenches in the insulating layer.

The mask material of the via hole etch stack may be a single deposited mask material layer or a stack of two or more deposited mask material layers. The mask material may be different from the upper layer material, the spacer material, and the intermediate layer material. The mask material may further be different from one or more of the lower layer material, the target memorization layer, and the insulating layer. The mask material may be deposited to form a planarizing mask material layer filling the trenches and covering the patterned upper memorization layer. The mask material may be an organic spin-on material, such as SOC.

Forming the opening in the via hole etch stack may comprise etching the mask material using an etching process adapted to etch the mask material at a greater rate than the spacer layer. This facilitates the opening to be self-aligned to the first set of lower trenches.

BRIEF DESCRIPTION OF THE FIGURES

The above, as well as additional objects, features, and advantages of the present inventive concept, will be better understood through the following illustrative and non-limiting detailed description, with reference to the appended drawings. In the drawings, like reference numerals will be used for like elements unless stated otherwise.

FIGS. 1-27 illustrate a process flow of a patterning method, in accordance with an example embodiment.

FIG. 1 illustrates a perspective view of a section of a structure to be subjected to various processing steps, in accordance with an example embodiment.

FIG. 2 illustrates a patterned upper memorization layer of the structure with upper trenches formed therein, in accordance with an example embodiment.

FIG. 3 illustrates sidewall spacer lines formed along sidewalls of the upper trenches, in accordance with an example embodiment.

FIGS. 4-5 illustrate steps for forming first mask blocks along the upper trenches, in accordance with an example embodiment.

FIG. 5 illustrates the first mask blocks, in accordance with an example embodiment.

FIG. 6 illustrates an intermediate memorization layer that has been patterned to form intermediate trenches therein, in accordance with an example embodiment.

FIG. 7 illustrates a corresponding view after removing the first mask blocks, in accordance with an example embodiment.

FIG. 9 illustrates an exposed bottom surface that has been etched back to form an opening in the target memorization layer, in accordance with an example embodiment.

FIG. 10 illustrates the opening transferred into the insulating layer, in accordance with an example embodiment.

FIG. 11 illustrates the structure after removing a via hole etch stack, in accordance with an example embodiment.

FIG. 13 illustrates an exposed upper surface of a remaining portion of a patterned upper memorization layer, in accordance with an example embodiment.

FIG. 14 illustrates the structure after a patterned intermediate, patterned lower, and target memorization layers have been sequentially etched back, in accordance with an example embodiment.

FIG. 15 illustrates the structure after removing the via hole etch stack, in accordance with an example embodiment.

FIG. 16 illustrates an auxiliary block mask stack, in accordance with an example embodiment.

FIG. 17 illustrates second mask blocks, in accordance with an example embodiment.

FIG. 18 illustrates the structure after a patterned upper memorization layer has been etched, in accordance with an example embodiment.

FIG. 19 illustrates second intermediate blocks and intermediate lines of the structure, in accordance with an example embodiment.

FIG. 20 illustrates trenches and upper blocks of the structure, in accordance with an example embodiment.

FIG. 21 illustrates a second auxiliary trench mask stack formed over the patterned lower memorization, in accordance with an example embodiment.

FIG. 22 illustrates transferring of the auxiliary trenches into the mask material by etching through the auxiliary trenches, in accordance with an example embodiment.

FIG. 23 illustrates forming of second lower trenches, in accordance with an example embodiment.

FIG. 24 illustrates a patterned lower memorization layer, in accordance with an example embodiment.

FIG. 25 illustrates patterning of the target memorization layer to form a first set of "target" trenches underneath the first lower trenches and a second set of "target" trenches underneath the second lower trenches, in accordance with an example embodiment.

FIG. 26 illustrates the structure after removal of intermediate lines, first and second intermediate blocks, upper blocks, and spacer lines from the patterned target memorization layer, in accordance with an example embodiment.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for patterning an underlying layer will now be described with reference to FIGS. 1-27. The method will be described in connection with patterning a target memorization layer 12, which in turn may be used for the purpose of patterning trenches in an insulating layer 10. The trenches in the insulating layer 10 may be filled with a conductive material, such as a metal, to form conductive lines of an interconnection level of an interconnection structure, e.g., in the back-end-of-line (BEOL). It is, however, noted that the method has a more general applicability for patterning trenches in any layer. For example, the layer 12 to be patterned may be a semiconductor layer or a metal layer.

Figure 1:
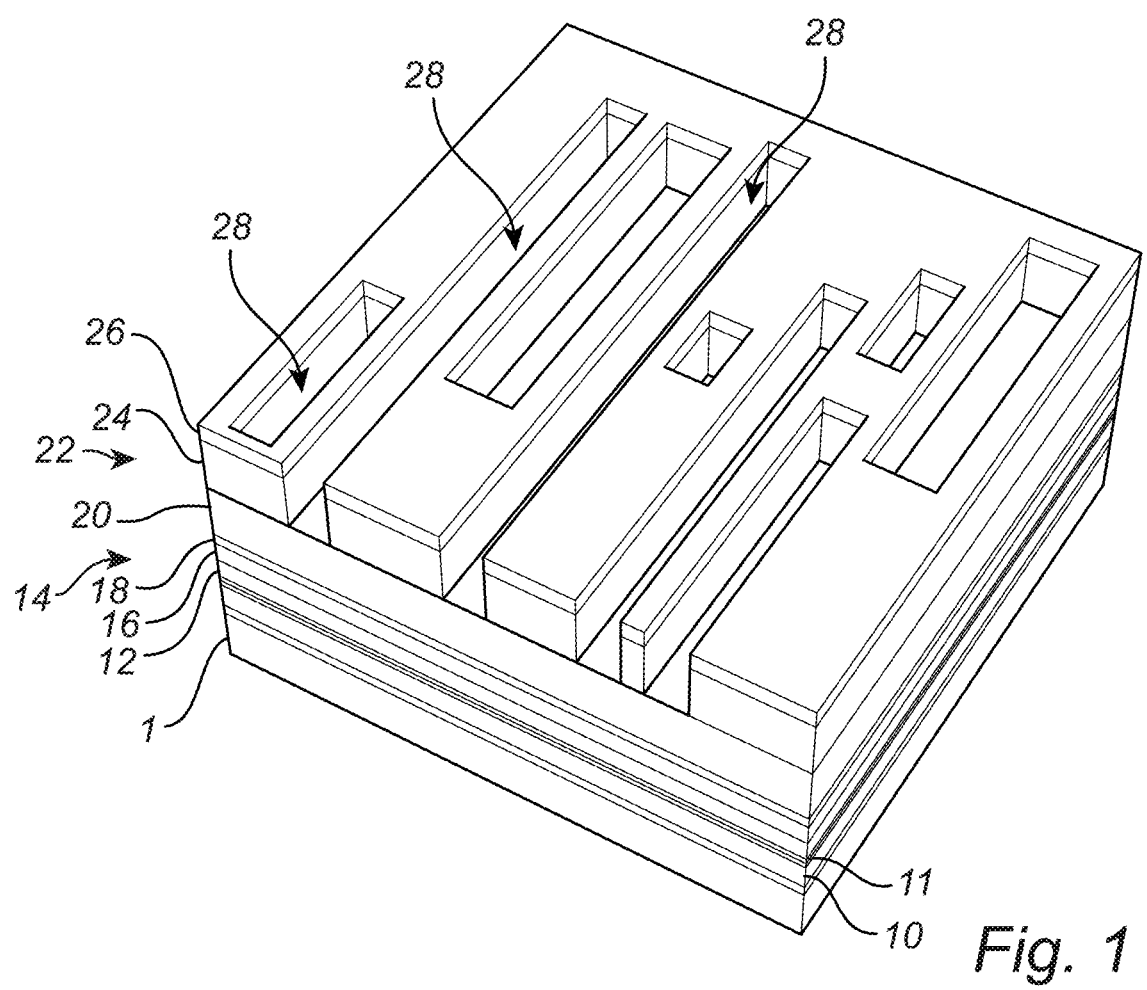

With reference to FIG. 1, there is shown, in perspective, a section of a structure which is to be subjected to the processing steps of the patterning method. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. In FIG. 1, directions X and Y indicate a first and a second horizontal direction, respectively, parallel to a main plane of extension and main surface of the layers. Direction Z indicates a vertical direction, or equivalently a bottom-up direction or layer stacking direction, thus normal to the main plane of extension and the main surface of the layers. As may be appreciated, terms such as "over," "above," "below," "upper," "underlying," "underneath" should be understood as relative positions as viewed along the vertical direction. Moreover, a "width" of a trench or a "line width" of a feature should be understood to refer to a dimension along the first horizontal direction X. A "longitudinal" or "length" dimension of a, e.g., a trench should be understood to refer to a dimension along the second horizontal direction Y.

FIG. 1 depicts a layer stack 14 comprising in the bottom-up direction a lower memorization layer 16, an intermediate memorization layer 18, and an upper memorization layer 20. As shown, the intermediate memorization layer 18 may be formed on the lower memorization layer 16. The upper memorization layer 20 may be formed on the intermediate memorization layer 18. The layer stack 14 is formed over or, as shown, on the underlying target memorization layer 12. However, it is envisaged that interfacial layers, such as an adhesion layer, may be provided between, e.g., the memorization layers 12 and 16, and/or 16 and 18, and/or 18 and 20. If an interfacial layer is present between two memorization layers, such as 16 and 18, the interfacial layer may be patterned in a same step as the higher layer, such as layer 18, or in a same step as the lower layer.

As may be understood from the following, the memorization layers 16, 18, 20 may, through patterning, be used to "memorize" or "store" one or more parts of a final "target" pattern that is to be transferred to the target memorization layer 12. The "target pattern" may then be transferred to the insulating layer 10. Hence, "the memorization layers" 12, 16, 18, 20 may instead be referred to as "patterning layers" 12, 16, 18, 20.

The target memorization layer 12 may be a layer of a metal-comprising material such as a metal nitride, a metal carbide, or a metal oxide, for instance, TiN, $W_xC_y$, $Al_xO_y$, or $Al_xN_y$. The lower memorization layer 14 may be a layer of a dielectric material such as an oxide or a nitride or a carbide, for instance, $SiO_2$, SiCO, SiC, SiN, or SiCN. The intermediate memorization layer 16 may be formed of any one of the materials mentioned in connection with the target memorization layer 12. The upper memorization layer 20 may be an a-Si layer. A non-limiting example of a combination of materials of the memorization layers 12, 16, 18, 20 is: a target memorization layer 12 of TiN, a lower memorization layer 16 of SiN, an intermediate memorization layer 18 of TiN, and an upper memorization layer 20 of a-Si. The memorization layers 12, 14, 16, 18 may, for instance, be deposited by chemical vapor deposition (CVD), atomic layer deposition (ALD), or physical vapor deposition (PVD).

As further shown in FIG. 1, the layer stack 14 may be formed over an insulating layer 10. The insulating layer 10 may be of an oxide material, such as $SiO_2$, or another conventional lower-k dielectric. One or more interfacial layers 11, for example, an interface layer and/or an oxide capping layer, may optionally be present between the target memorization layer 12 and the insulating layer 10.

The insulating layer 10 may be formed over a substrate 1, for instance, a semiconductor substrate. An active device layer including semiconductor devices such as transistors may be fabricated on a main surface of the substrate 1. The active device layer may also be referred to as a front-end-of-line portion (FEOL-portion). The insulating layer 10 may be formed over (not shown) conductive structures, such as conductive lines of a lower interconnection level, or contact structures for devices, such as source/drain or gate contacts of semiconductor devices, as per se is known in the art.

Figure 2:
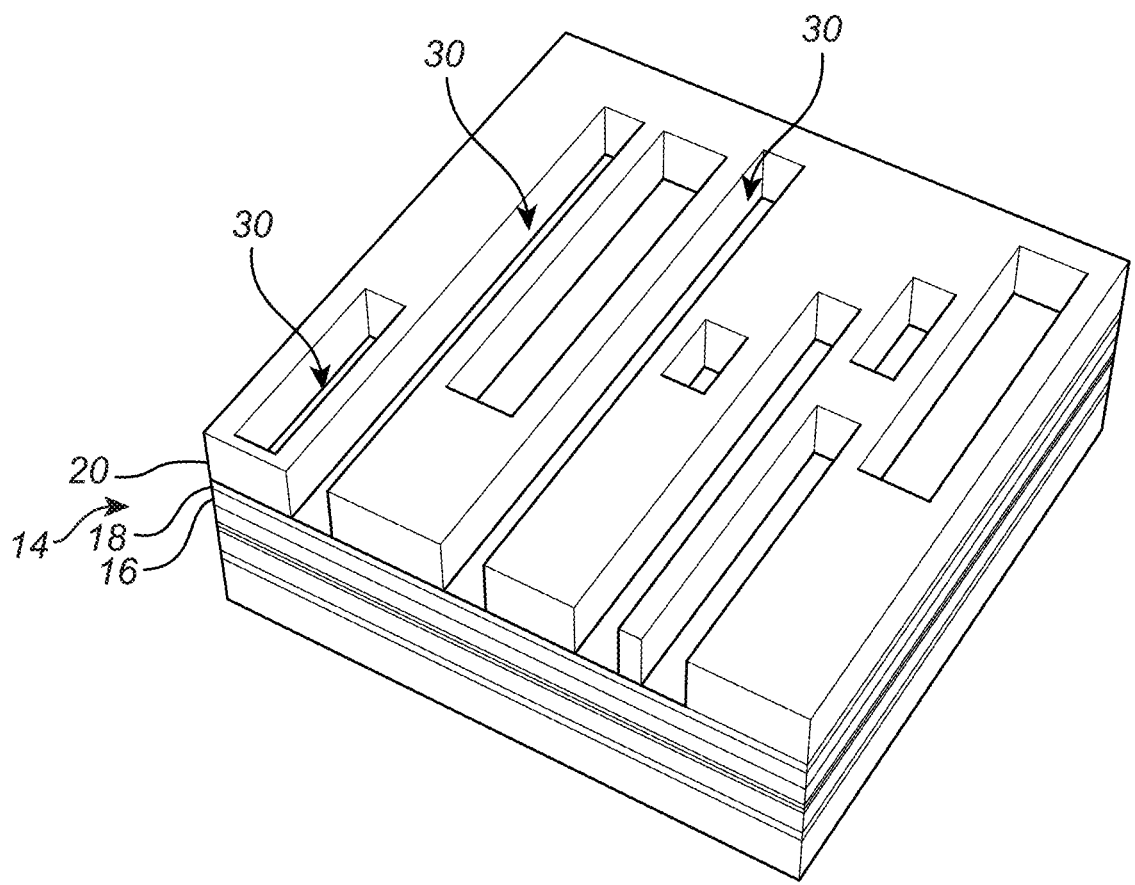

FIGS. 1-2 illustrate process steps of patterning the upper memorization layer 20 to form a set of upper trenches 30 in the upper memorization layer 20. The upper trenches 30 are formed using lithography and etching. As shown in FIG. 1, a (first) auxiliary trench mask stack 22 comprising a mask material 24 and a resist layer 26 is formed over the upper memorization layer 20. The mask material 24 may, for instance, be an organic spin-on material such as SOC. The auxiliary trench mask stack 22 is patterned to form auxiliary trenches 28. The auxiliary trenches 28 may first be formed in the resist layer 26 by lithography and then transferred into the mask material 24 by etching. The upper trenches 30 may thereafter be formed by etching the upper memorization layer 20 through the auxiliary trenches 28, while the patterned auxiliary trench mask stack 22 masks the upper memorization layer 20. Although not shown, the auxiliary trench mask stack 22 may comprise additional layers under the resist layer 26, such as one or more anti-reflective coatings such as SiOC layers and/or spin-on-glass layers. An alternative to a mask stack may be to form a resist layer directly on the upper memorization layer 30. The upper trenches 30 may be etched using a suitable etching process, for instance, a dry etch, e.g., Reactive Ion Etching (RIE). For example, etching chemistries comprising Bromine (e.g., HBr), Chlorine (e.g., $Cl_2$), or Fluorine (e.g., $SF_6$, $CF_4$) may be tuned to achieve a selective "a-Si etch," i.e., selective etching of a-Si with respect to the auxiliary trench mask stack 22, e.g., comprising organic spin-on material such as SOC.

FIG. 2 shows the thusly patterned upper memorization layer 20 with the upper trenches 30 formed therein. The auxiliary trench mask stack 22 may subsequently be removed from the patterned upper memorization layer 20. The upper trenches 30 may as shown expose upper surface portions of the intermediate memorization layer 18. Each upper trench 30 is formed above a region of the target memorization layer 12 (and insulating layer 10) where a first target trench 96 is to be formed (c.f. e.g., FIG. 25). As shown, the upper trenches 30 may be formed with various widths (along the first horizontal direction X) and various longitudinal dimensions (along the second horizontal direction Y). The upper trenches 30 may extend in parallel to the second horizontal direction Y.

Figure 3:
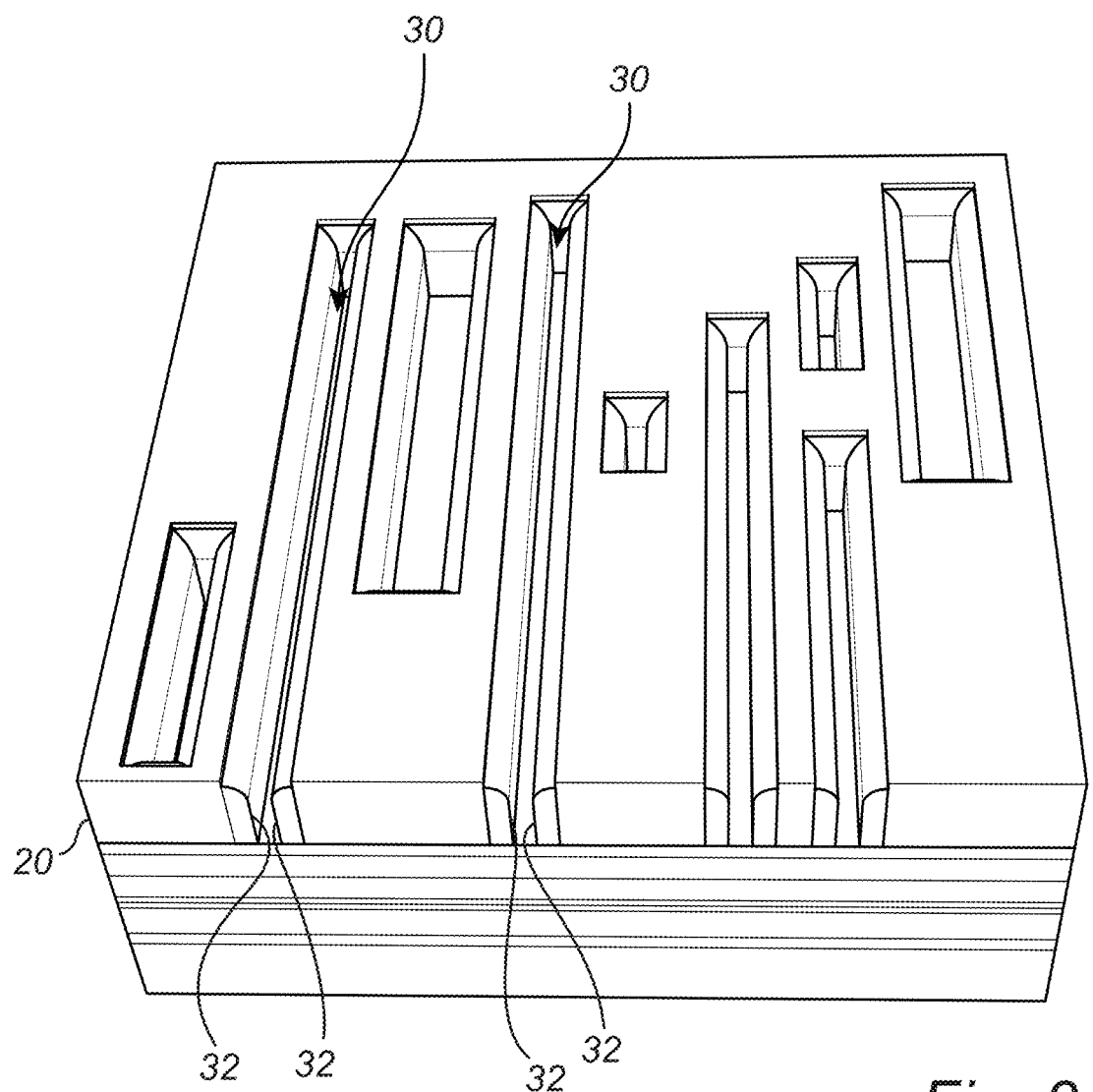

In FIG. 3, sidewall spacer lines 32 have been formed along sidewalls of the upper trenches 30. The spacer lines 32 may be formed in a sidewall spacer deposition process by an ALD-deposited material such as oxide, e.g., $SiO_2$ or a metal oxide layer, e.g., $AlO_x$ or $TiO_x$, or a carbide or nitride, e.g., SiCO, SiN, AlN, AlON, SiCN. The spacer lines 32 may as shown in FIG. 3 conform to the sidewalls of each upper trench 30. In other words, the spacer lines 32 may cover and extend along the sidewalls of the upper trenches 30. As further indicated in FIG. 3, spacer lines 32 may also form on end walls of the upper trenches 30. Such end wall spacer portions may thus connect the sidewall spacer lines 32 formed on mutually opposite sidewalls of each respective upper trench 30.

Figure 4:
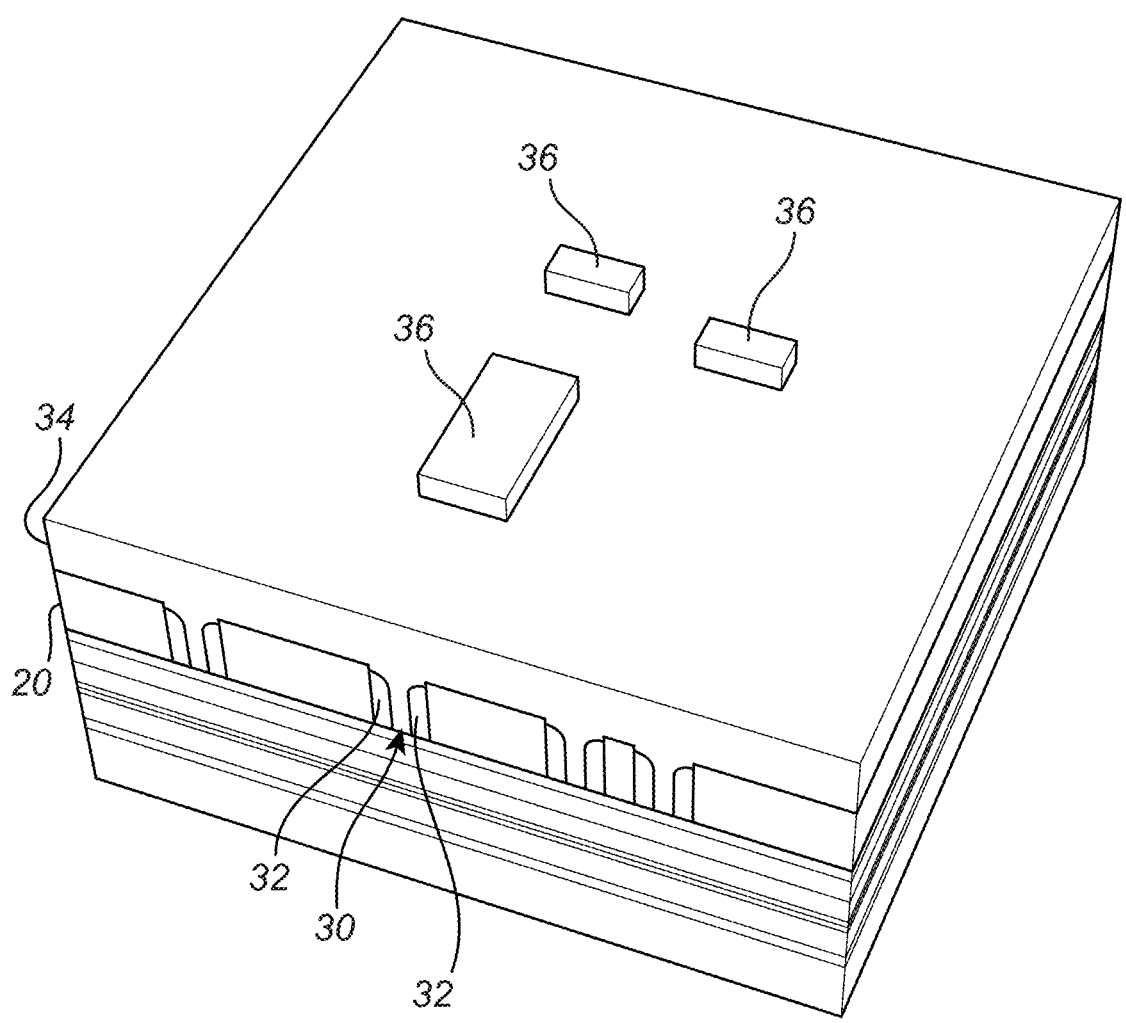
Figure 5:
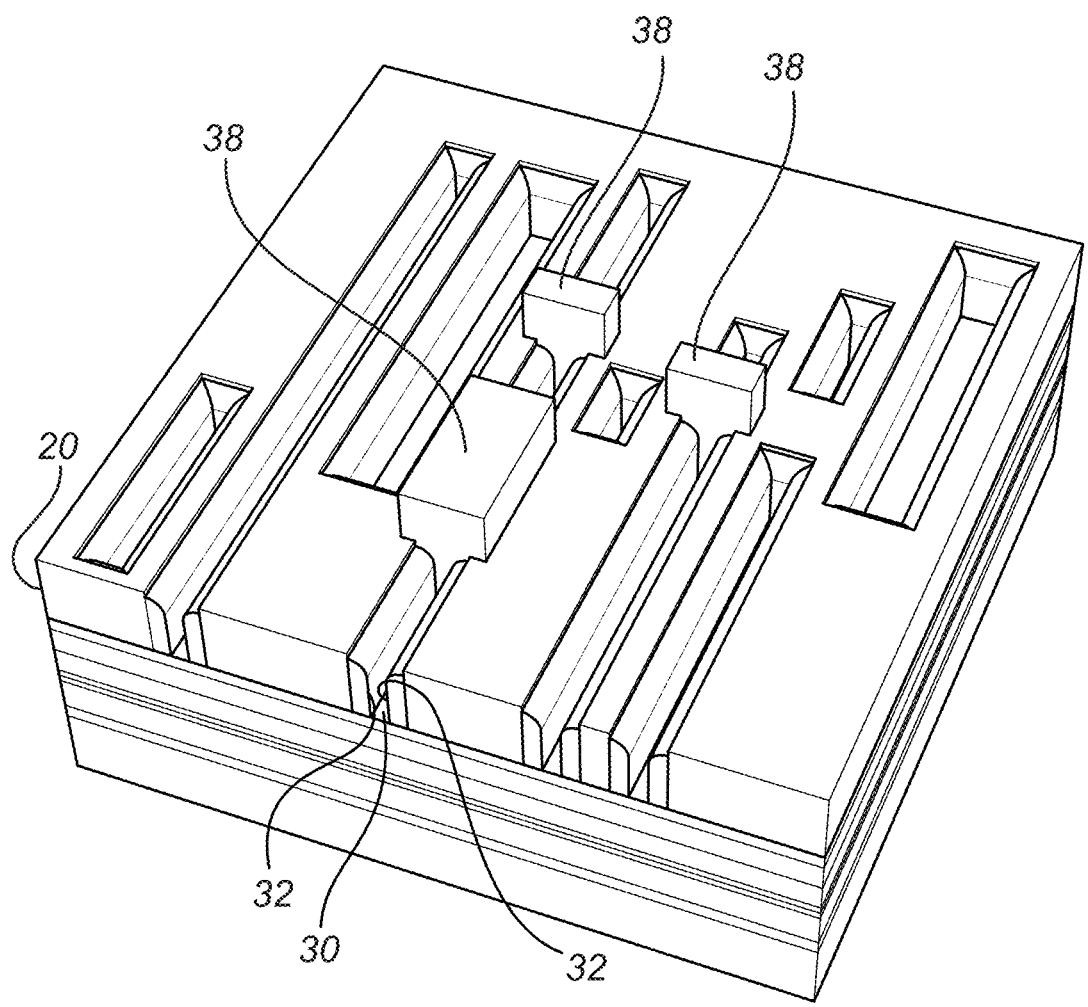

FIGS. 4-5 illustrate steps for forming first mask blocks 38 along the upper trenches 30. As shown, the first mask blocks 38 may be formed by patterning a mask block layer 34 using lithography (FIG. 4 shows a lithographically patterned resist blocks 36) and etching the mask block layer 34 while the resist blocks 36 masks the mask block layer 34. The mask block layer 34 may be formed by SOC or some other organic spin-on material.

FIG. 5 shows the first mask blocks 38. Each mask block 38 may extend across an upper trench 30 (which has been provided with sidewall spacer lines 32). After forming the first mask blocks 38, the resist blocks 36 may be removed. It should be noted that the number of first mask blocks 38 shown in FIG. 5 is merely an example, and that both fewer or more first mask blocks 38 may be formed, such as one or more first mask blocks 38.

First mask blocks 38 may also be formed in a tone-inverted approach. That is, openings may be formed by lithography and etching in a temporary planarizing layer (e.g., a SOC layer) deposited over the upper memorization layer 20. The openings may be filled with mask block material (e.g., spin-on-glass, a metal oxide, e.g., $TiO_x$ or $ZrO_x$, or some other oxide, dielectric or metal-based material compatible with the composition of the layer stack) to form the first mask blocks 38. The temporary layer may then be removed, leaving the mask blocks 38 along the upper trenches 30.

Figure 6:
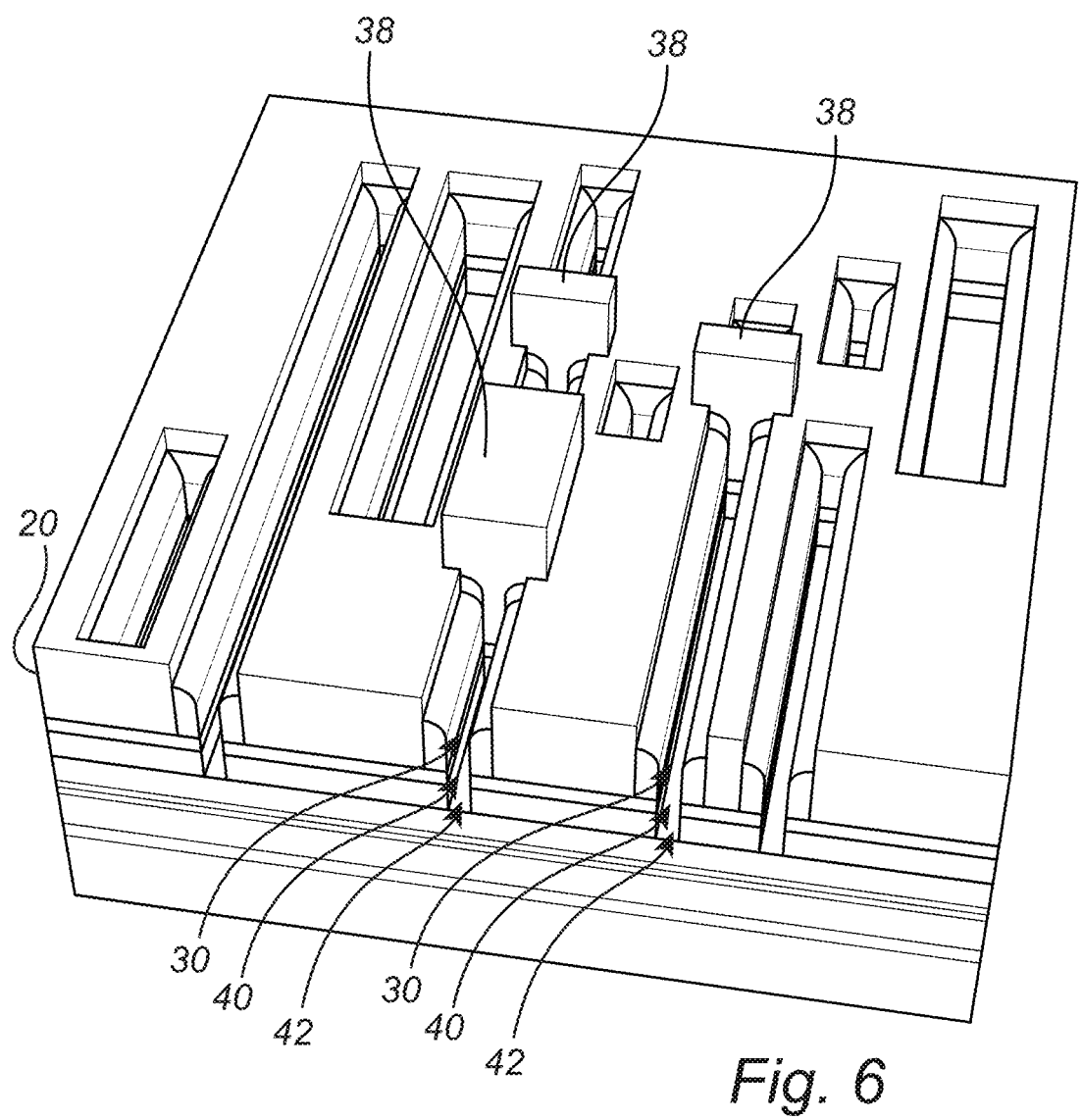

In FIG. 6, the intermediate memorization layer 18 has been patterned to form intermediate trenches 40 therein. The patterning may comprise etching the intermediate memorization layer 18 while the patterned upper memorization layer 20, the spacer lines 32 and the first mask blocks 38 mask the intermediate memorization layer 18. In other words, the patterning may comprise vertically etching back upper surface portions of the intermediate memorization layer 18 underneath or exposed in the upper trenches 30 (i.e., upper surface portions which are not masked by the first mask blocks 38 or spacer lines 32). The intermediate trenches 40 may as shown expose upper surface portions of the lower memorization layer 16.

Subsequent to patterning the intermediate memorization layer 18, the lower memorization layer 16 has been patterned to form first lower trenches 42 therein. The patterning may comprise etching the lower memorization layer 18 while the patterned upper memorization layer 20, the spacer lines 32, the first mask blocks 38 and the patterned intermediate memorization layer 18 mask the lower memorization layer 16. In other words, the patterning may comprise vertically etching back upper surface portions of the lower memorization layer 16 underneath or exposed in the intermediate trenches 40. The first lower trenches 42 may as shown expose upper surface portions of the target memorization layer 12.

Figure 7:
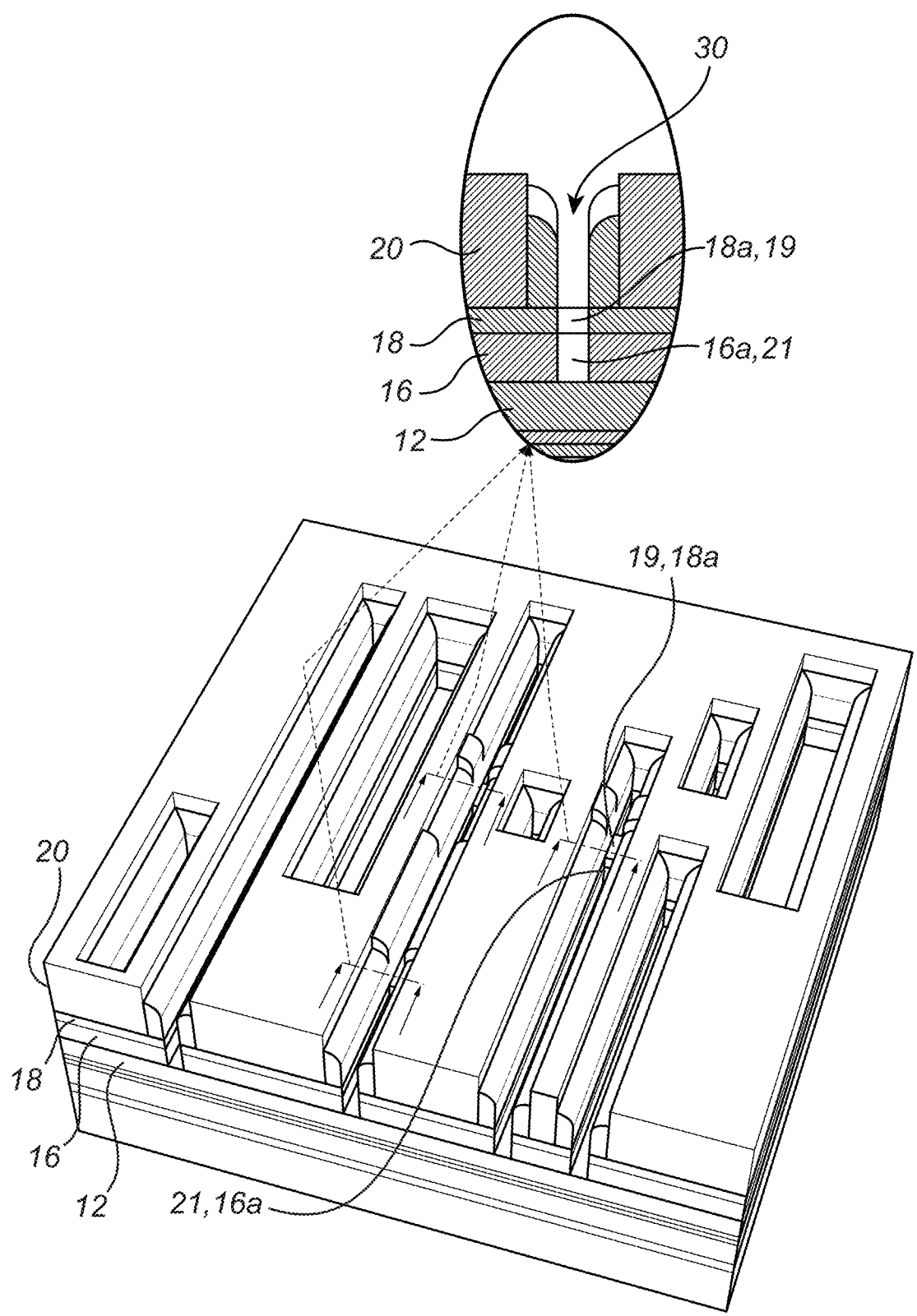

FIG. 7 shows a corresponding view after removing the first mask blocks 38. For example, SOC material may be removed in an "SOC etch," such as an RIE using an Ar- or He-diluted oxygen-comprising etching chemistry, or an $N_2/H_2$ based etching chemistry.

As may be seen from FIGS. 6 and 7, underneath each first mask block 38, a first intermediate block 19 has been formed by a respective first intermediate memorization layer portion 18a masked by the first mask block 38 during the etching of the intermediate memorization layer 18. Hence, a respective first intermediate memorization layer portion 18a may be preserved underneath each first mask block 38. Accordingly, at least a subset of the intermediate trenches 40 are interrupted by a respective first intermediate block 19.

Moreover, underneath each first mask block 38 and each first intermediate block 19, a first lower block 21 has been formed by a respective first lower memorization layer portion 16a masked by the first mask block 38 and the first intermediate block 19 during the etching. Hence, a respective first lower memorization layer portion 16a may be preserved underneath each first intermediate block 19. Accordingly, at least a subset of the first lower trenches 42 are interrupted by a respective first lower block 21.

In the inset of FIG. 7, the blocks 19 and 21 are shown without hatching. This is, however, only for illustrative purposes and the blocks 19, 21 are, as described above, formed of remaining portions 18a, 16a of the layers 18 and 16, respectively.

The patterning of the intermediate memorization layer 18 and the lower memorization layer 16 may comprise etching using an etching process, such as a dry etching process, allowing the respective memorization layers 18, 16 to be etched at a greater rate than the upper memorization layer 20, the spacer lines 32 and the first mask blocks 38. For instance, a SiN layer and a TiN layer may be etched at a greater rate than each one of SOC, a-Si and an oxide such as a silicon or metal oxide (e.g., $SiO_2$ or $TiO_x$) by RIE using fluorine-based etching chemistries.

After the patterning of the intermediate memorization layer 18 and the lower memorization layer 16, the first mask blocks 38 and the spacer line-provided upper trenches 30 have thus been "memorized" both in the patterned intermediate memorization layer 18 and in the patterned lower memorization layer 16. Although in FIG. 6, the first mask blocks 38 also remain during the patterning of the lower memorization layer 16. It is possible to remove the first mask blocks 38 directly after patterning the intermediate memorization layer 18.

A (first) via formation process for patterning (first) via openings aligned with the first set of target trenches 96 in the target memorization layer 12, and a (second) via formation process for patterning (second) via openings aligned with the second set of target trenches 98 in the target memorization layer 12, will now be described with reference to FIGS. 8-11 and 12-15, respectively. If it is not desired to form first and/or second via openings, the relevant steps may be omitted. The method may thereafter proceed to FIG. 16.

Figure 8A:
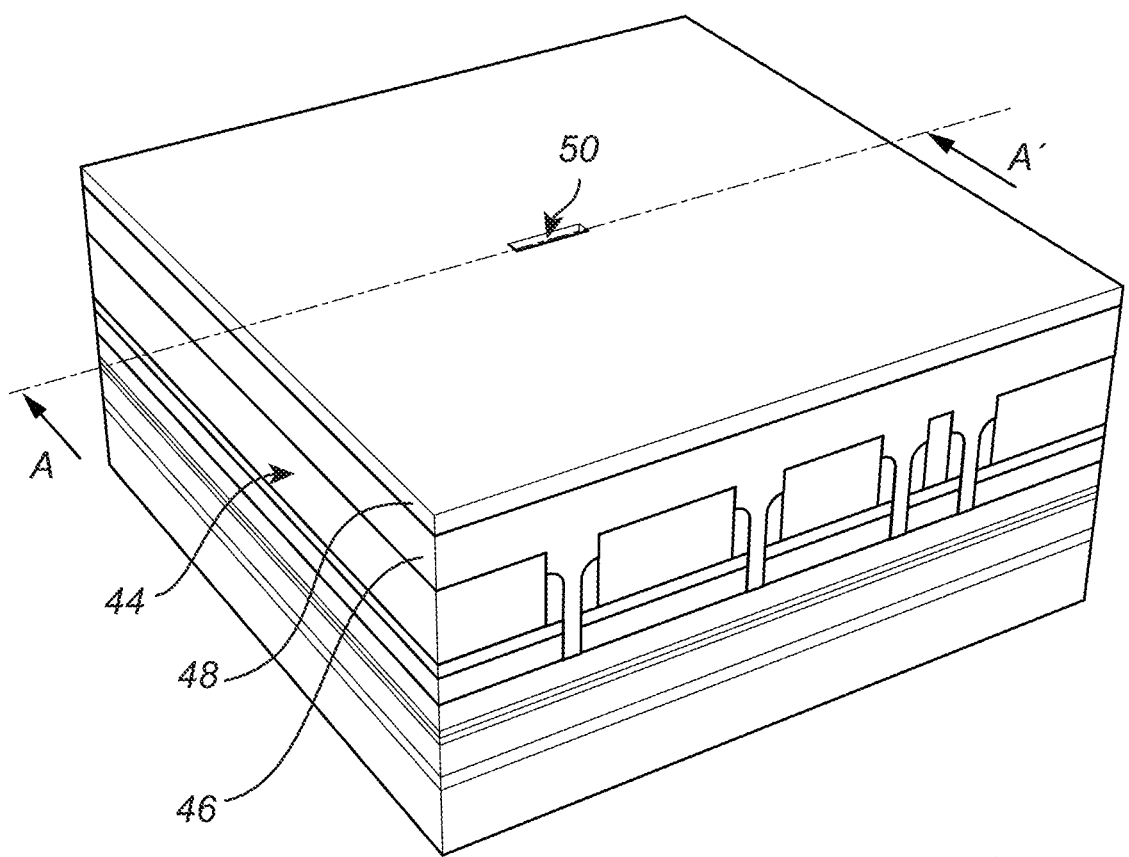
FIG. 8a illustrates an opening formed in the structure, in accordance with an example embodiment.
Figure 8B:
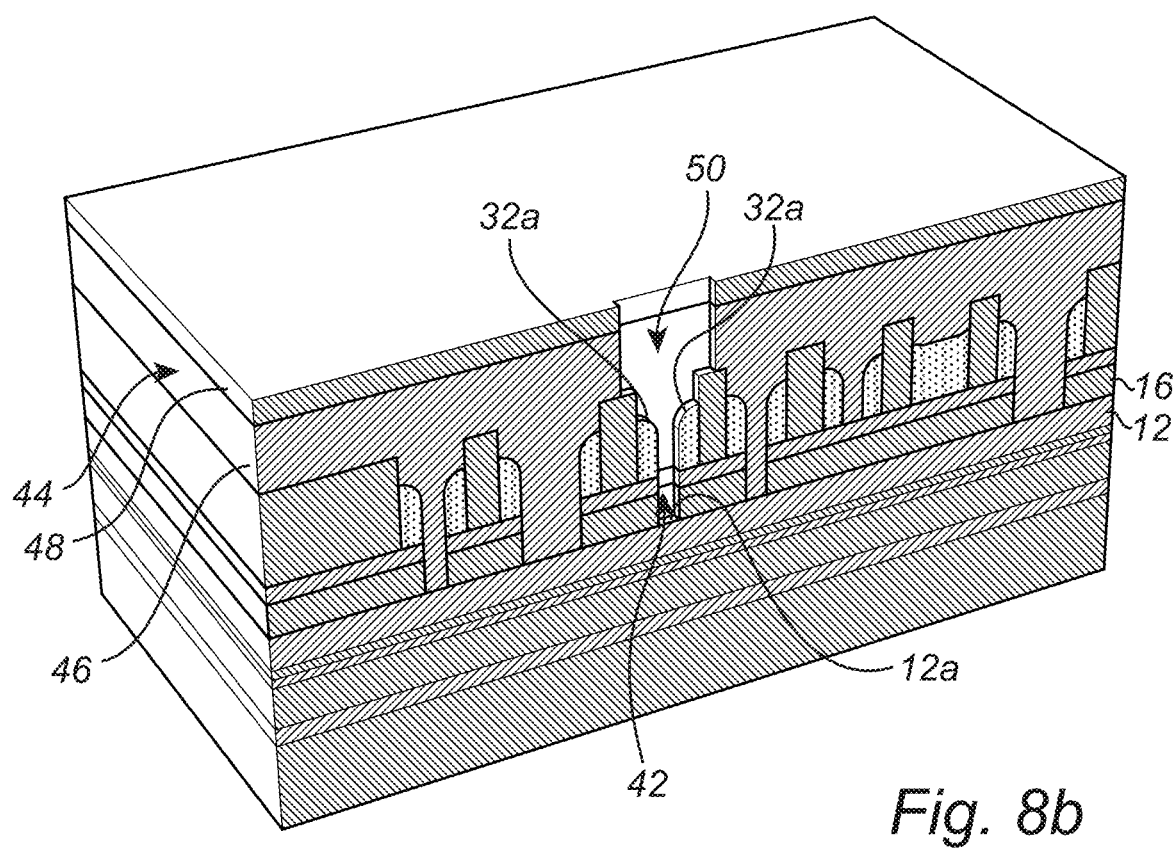
FIG. 8b illustrates a cross-section of the structure along section A-A' of FIG. 8a, in accordance with an example embodiment.

FIG. 8b shows a cross-section of the structure along the line A-A' indicated in FIG. 8a. A (first) via hole etch stack 44 has been formed over the structure. The via hole etch stack 44 may comprise a mask material 46 filling the lower, the intermediate, and the upper trenches 30, 40, 42. The mask material 46 may form a planarizing layer covering the patterned upper memorization layer 20. The mask material 46 may be SOC or other organic spin-on layer. The via hole etch stack 44 may further comprise a resist layer 48, formed over the mask material 46. Although not shown, the via hole etch stack 44 may comprise additional mask materials, such as one or more anti-reflective coatings, such as SiOC layers, and/or a spin-on-glass layer between a SOC layer and the resist layer 48.

An opening 50 has been formed in the via hole etch stack 44 by lithography and etching. The opening is formed above a "selected" first lower trench 42 at a position underneath which a via opening is desired. The opening 50 may extend through the via hole etch stack 44 to expose a bottom surface of the selected first lower trench 42, the bottom surface 12a formed, e.g., by an upper surface portion of the target memorization layer 12.

Etching the mask material 46 using an etching process adapted to etch the mask material 46 at a greater rate than the spacer lines 32 allows the opening 50 to be self-aligned with respect to the spacer lines 32. The opening 50 may by extension be self-aligned also with respect to the selected first lower trench 42. A relaxed CD opening 50 may hence be lithographically defined in the resist layer 48 and transferred into the mask material 46. During etching of the mask material 46, the opening 50 may thus expose spacer layer portions 32a on opposite sides of the selected first lower trench 42. For example, an organic spin-on material such as SOC may be etched at a greater rate than an oxide spacer using a SOC etch, as discussed above. After forming the opening 50, the resist layer 48 may be removed. FIGS. 8a and 8b show one opening 50. However, as may be appreciated, any number of openings 50 may be formed, in accordance with the number of via openings desired.

Figure 9:
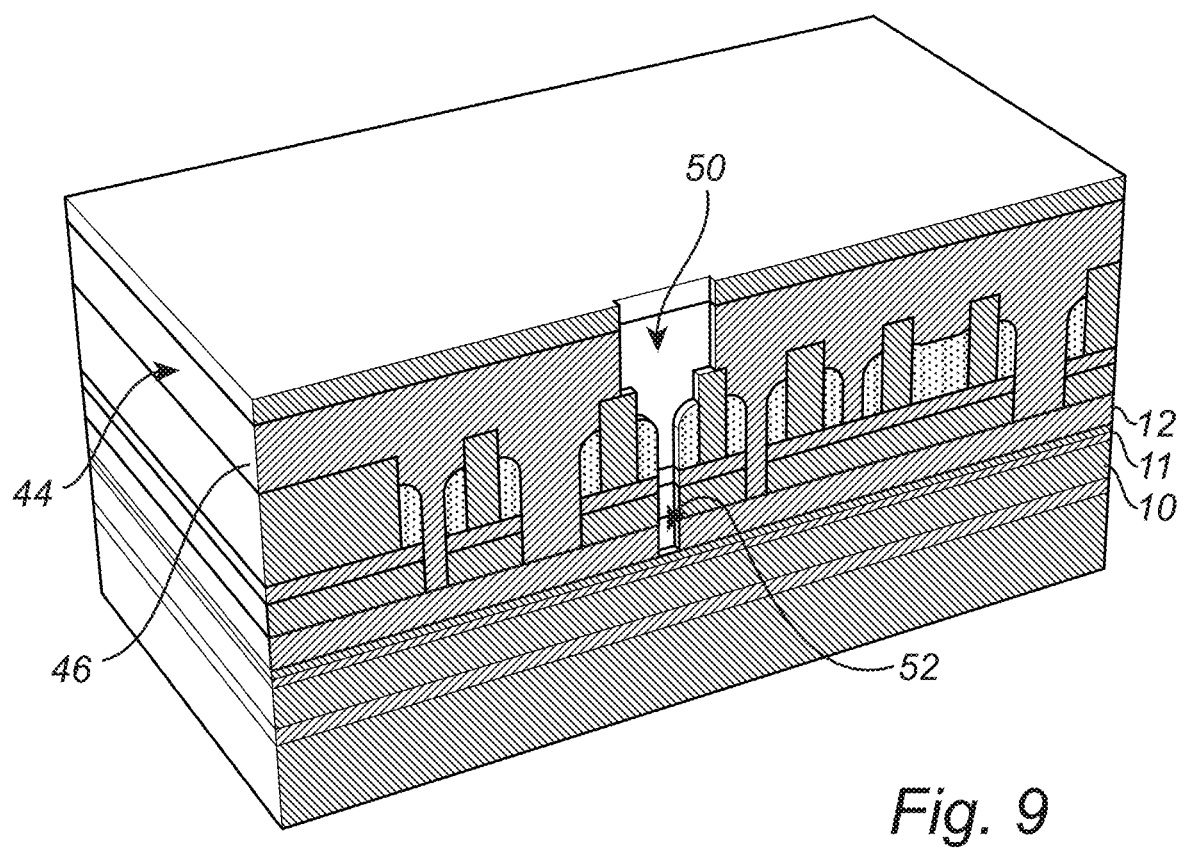
Figure 10:
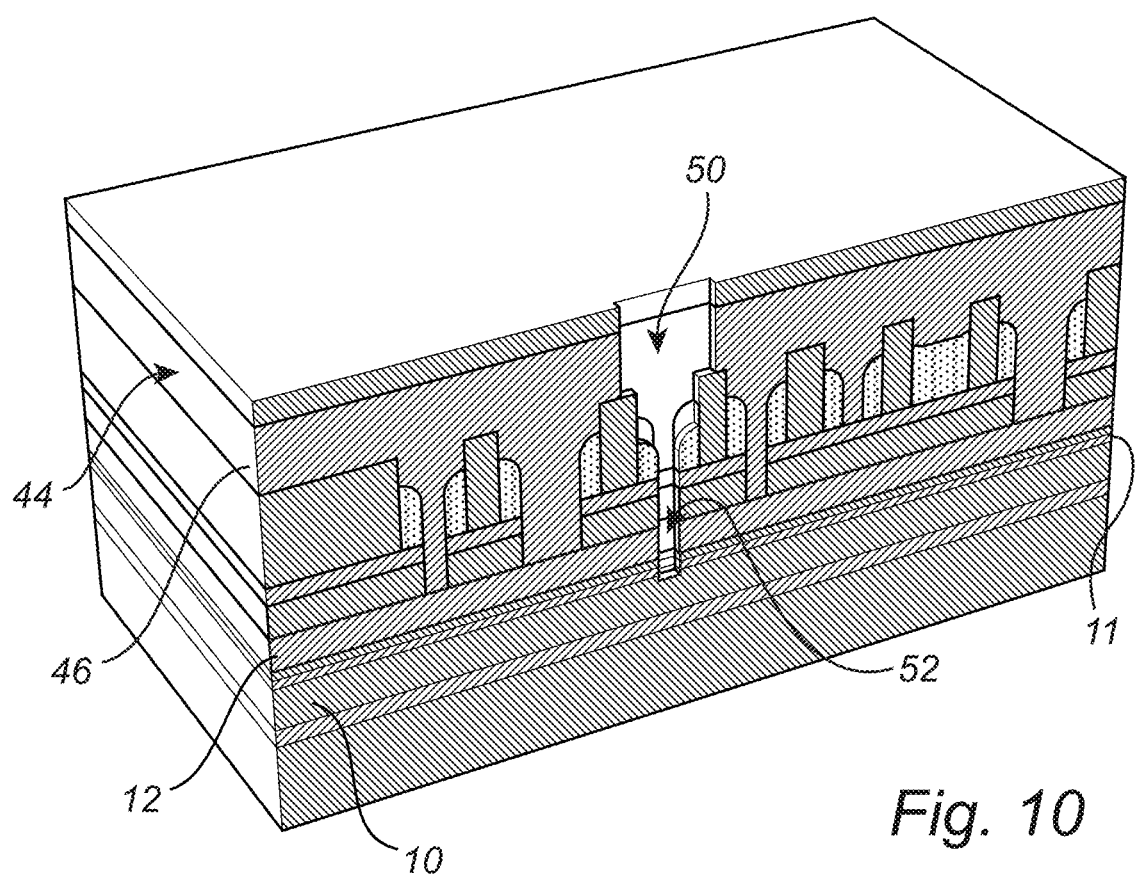
Figure 11:
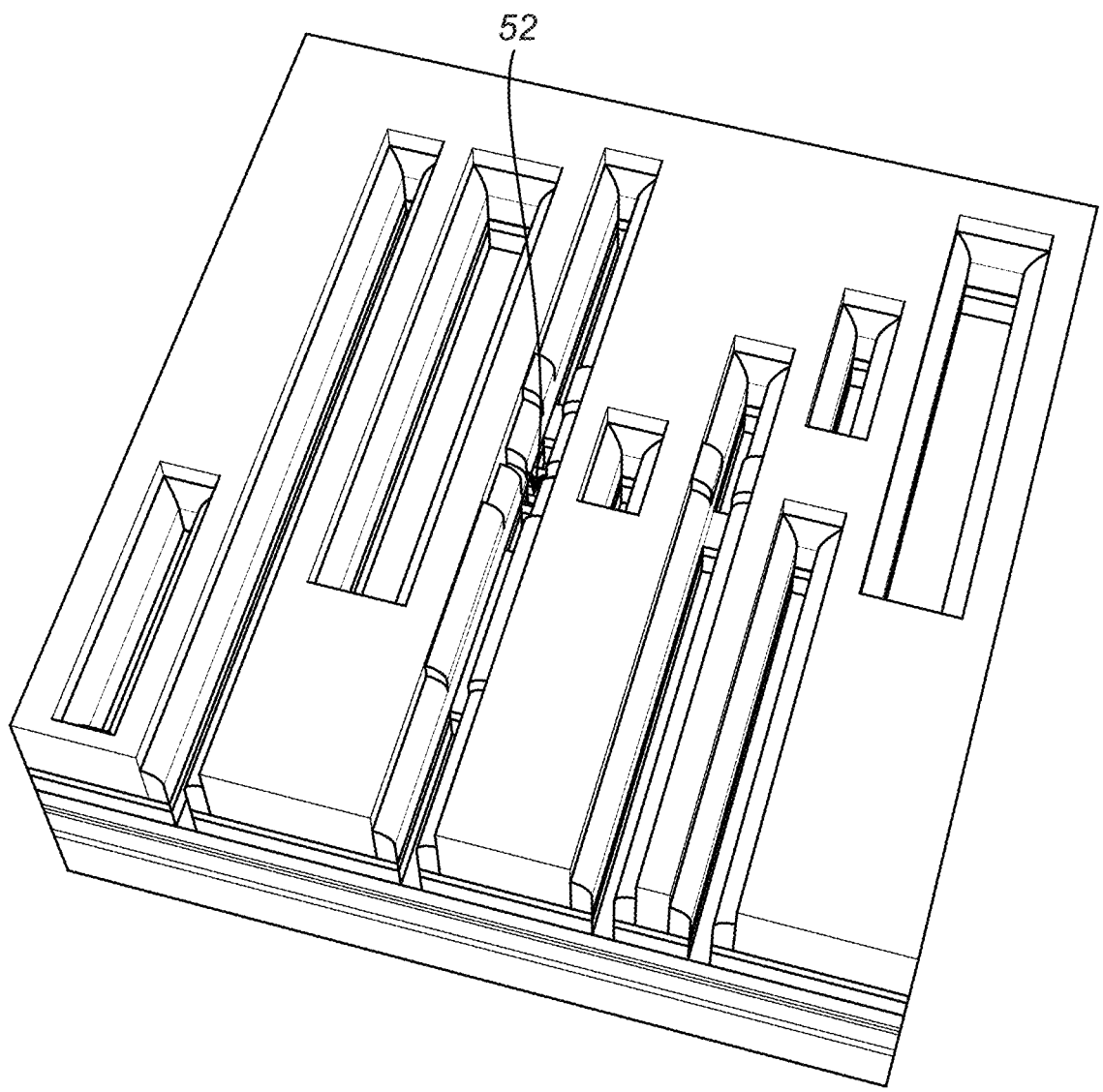

In FIG. 9, the exposed bottom surface 12a has been etched back to form an opening 52 in the target memorization layer 12. The opening 52 may, as further shown in FIG. 10, also be transferred into the insulating layer 10, and any interfacial layers 11, if present, by etching the layer(s) 10/11 through the opening 52 in the target memorization layer 12. A depth of the opening 52 in the layer(s) 10/11 may at this stage be of only an initial depth, and deepened at a later stage, such as during the etching of trenches in the insulating layer 10. FIG. 11 shows the structure after removing the via hole etch stack 44.

Figure 12A:
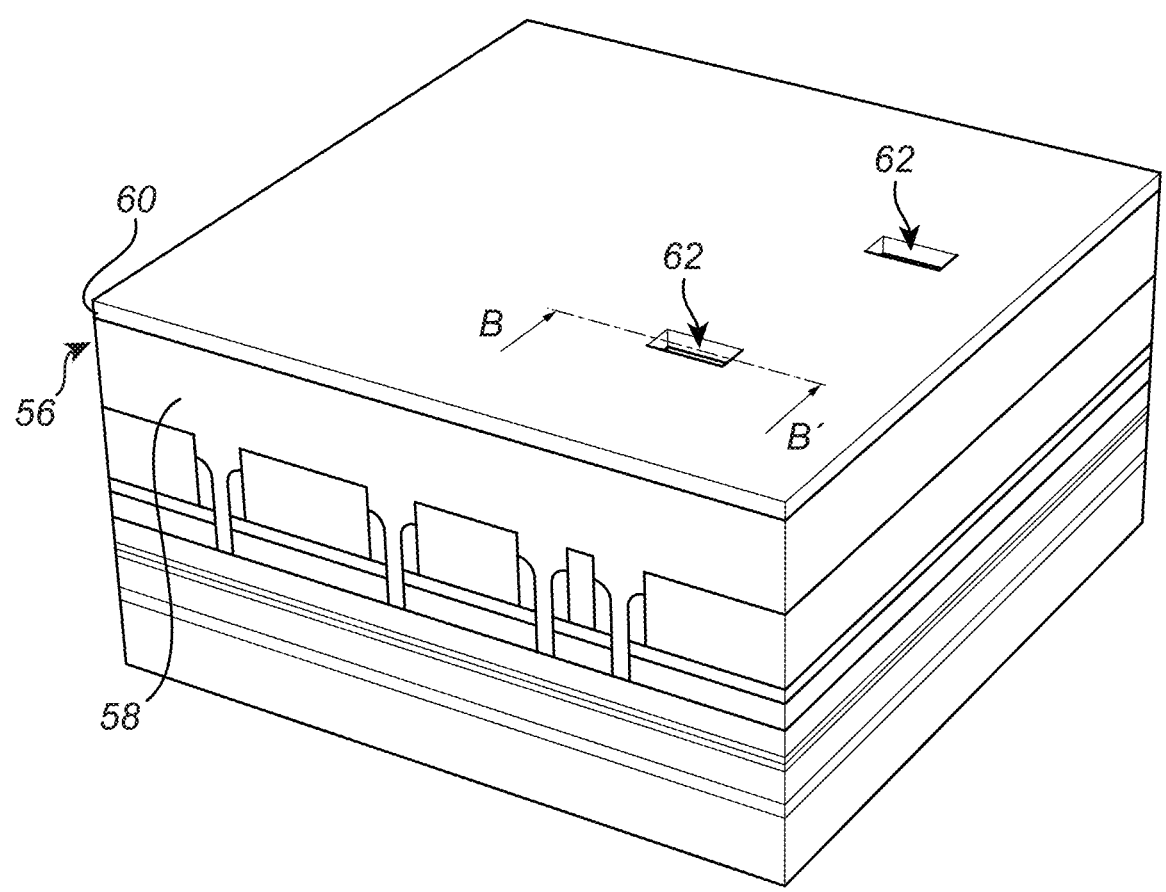
FIG. 12a illustrates a second via hole etch stack formed over the structure, in accordance with an example embodiment.
Figure 12B:
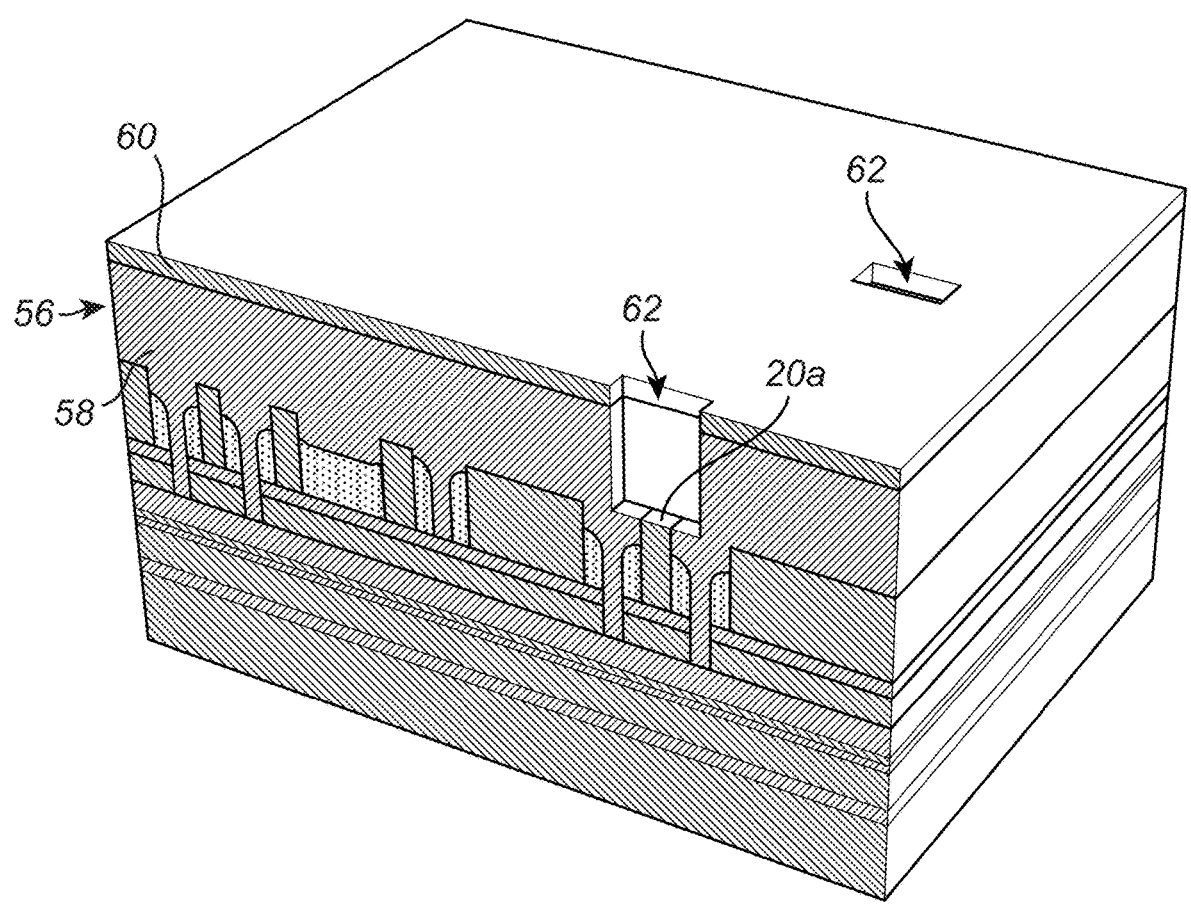
FIG. 12b illustrates a cross-section of the structure along section B-B' of FIG. 12a, in accordance with an example embodiment.

FIG. 12b shows a cross-section of the structure along the line B-B' indicated in FIG. 12a. A (second) via hole etch stack 56 has been formed over the structure. The via hole etch stack 56 may comprise a mask material 58 filling the upper, the intermediate, and first lower trenches 30, 40, 42. The mask material 58 may form a planarizing layer covering the patterned upper memorization layer 20. The mask material 58 may be a SOC or other organic spin-on material. The via hole etch stack 56 may further comprise a resist layer 60. Similar to the discussion of the via hole etch stack 44, additional mask materials (e.g., anti-reflective coatings) may be present in the via hole etch stack 44.

Openings 62 have been formed in the via hole etch stack 56 by lithography and etching. Reference will now be made to the opening 62 through which the cross-section extends. However, the following description applies correspondingly to any further opening 62. The opening 62 is formed above a remaining portion of the patterned memorization layer 12 (where a second lower trench is to be formed) at a position underneath which a via opening is desired. The remaining portion of the patterned memorization layer 12 may as shown be located between a pair of upper trenches 30. The opening 62 may extend through the via hole etch stack 56 to expose an upper surface 20a of a remaining portion of the patterned upper memorization layer 20. To preserve mask budget, the etching of the mask material 58 may be stopped when the upper surface 20a is exposed.

Figure 13:
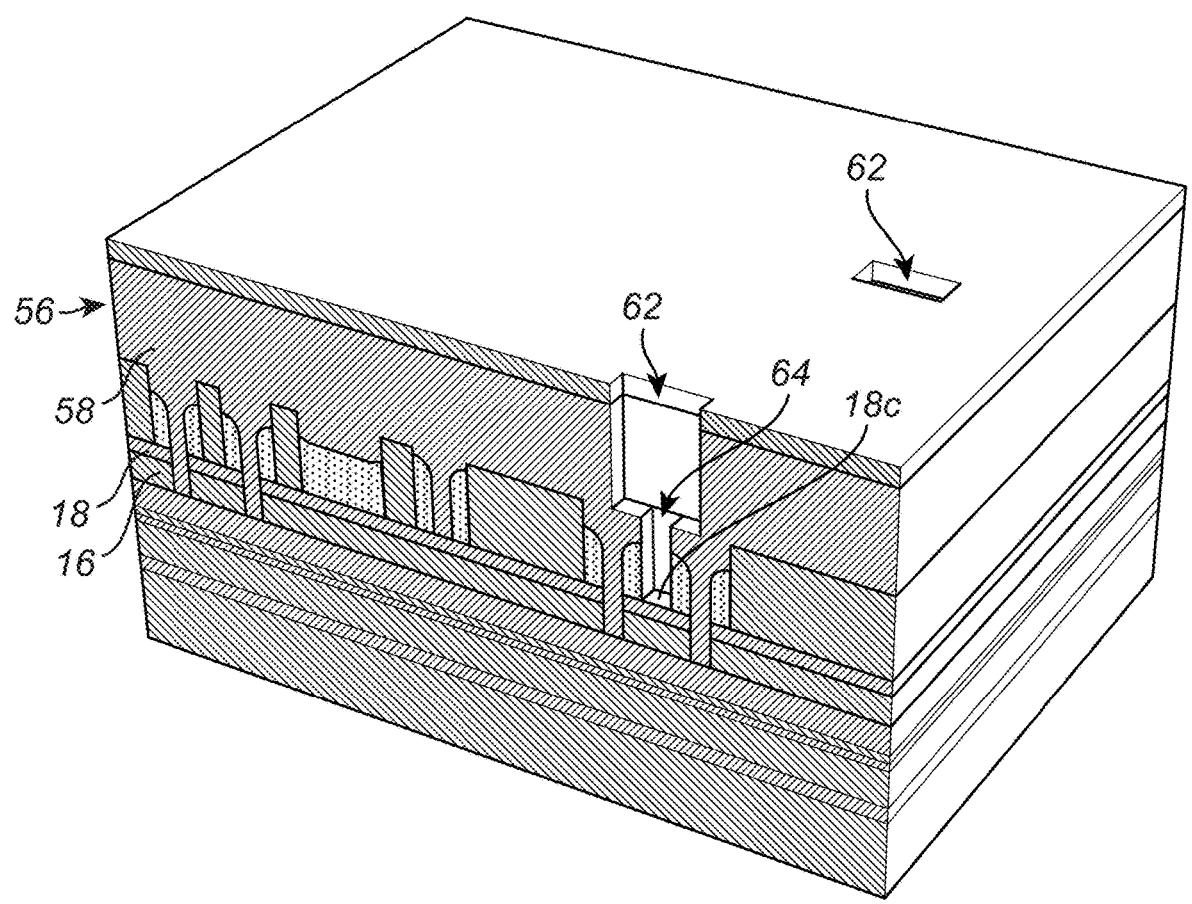

In FIG. 13, the exposed upper surface 20a of the remaining portion of the patterned upper memorization layer 20 has been etched back to form an opening 64 in the patterned upper memorization layer 20. The opening 64 may thus expose an upper surface portion 18c of the intermediate memorization layer 18. Etching the patterned upper memorization layer 20 using an etching process adapted to etch the patterned upper layer memorization layer 20 at a greater rate than the mask material 58 and at a greater rate than the spacer lines 32 (i.e., of the spacer material) allows the opening 64 to be self-aligned with respect to the spacer lines 32. A relaxed CD opening 62 may hence be lithographically defined in the resist layer 60 and transferred into the mask material 58. By extension, and as illustrated in FIG. 13, a width of the opening 62 in the via hole etch stack 56 may exceed a spacing between the pair of upper trenches 30 on either side of the remaining portion of the patterned upper memorization layer 20.

Figure 14:
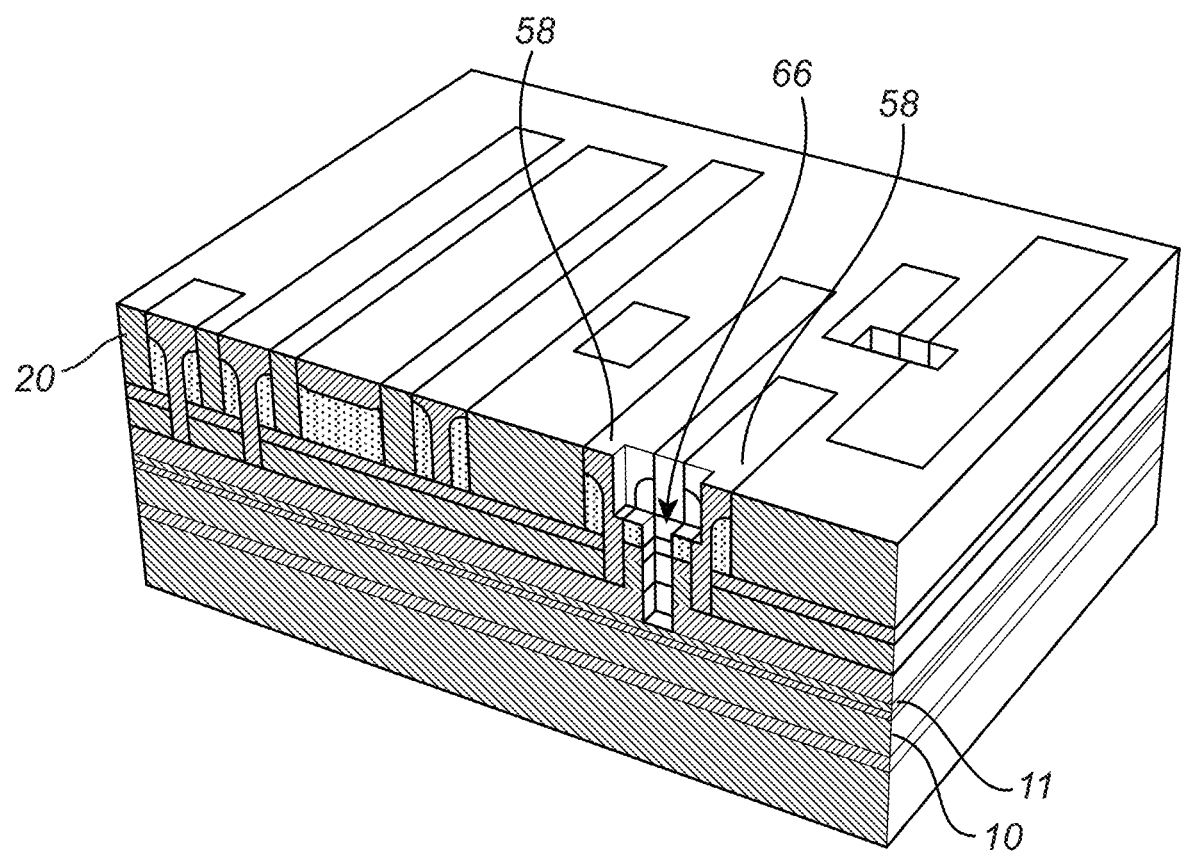

In FIG. 14, the patterned intermediate, patterned lower, and target memorization layers 18, 16, 12 have been sequentially etched back through the opening 64 in the patterned upper memorization layer 20. An extended opening 66 extending through the memorization layers 18, 16, 12 may thereby be formed. If the opening 62 in the via hole etch stack 56 forms a relaxed CD opening, as discussed above, an etch back of the upper surface portions of the mask material 58 and portions of the spacer lines 32 may also take place during the etching of the opening 64. As may be appreciated, the presence of the intermediate memorization layer 18 may, however, provide an improved etch budget for subsequent patterning steps, even if the etching of the opening 64 results in a back-etch of the spacer lines 32.

Figure 15:
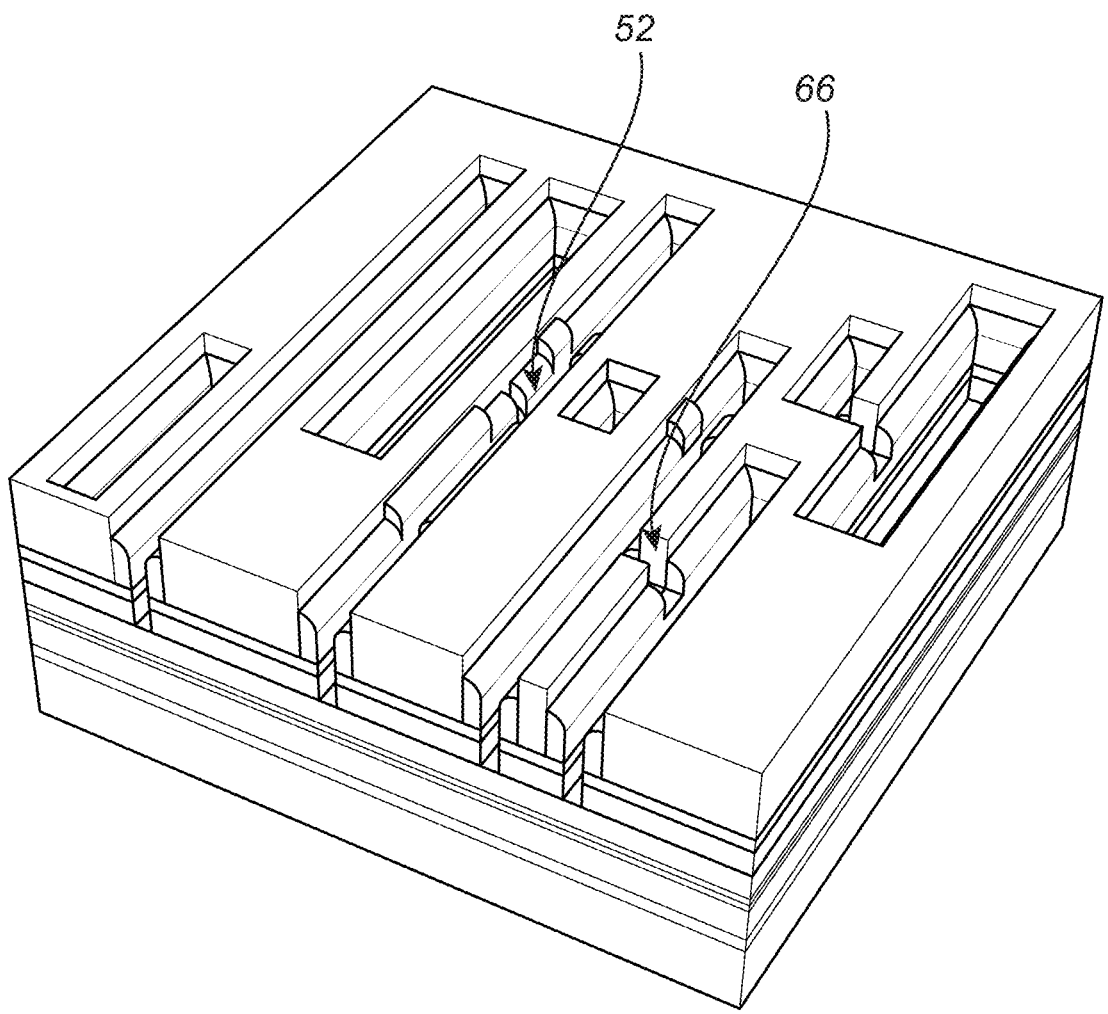

A bottom surface of the extended opening 66 may be formed by an upper surface portion of the insulating layer 10 or of an interfacial layer 11 if present. The extended opening 66 has hence not yet been transferred into lower layers to form a via opening 67 (seen in FIG. 26) but this may take place during subsequent patterning steps, such as during the below described patterning of the patterned intermediate memorization layer 18, patterning of second lower trenches 88, and/or the etching of trenches in the insulating layer 10. It is, however, also possible to already at this stage etch at least an initial via opening 67 in the insulating layer 10 (and/or any interfacial layer 11), to be deepened at a later stage, such as during the etching of trenches in the insulating layer 10. The initial via opening 67 may be etched to a same level/depth in the layer(s) 10/11 as the initial via opening 52 shown in FIG. 10. FIG. 15 shows the structure after removing the via hole etch stack 56.

Figure 16:
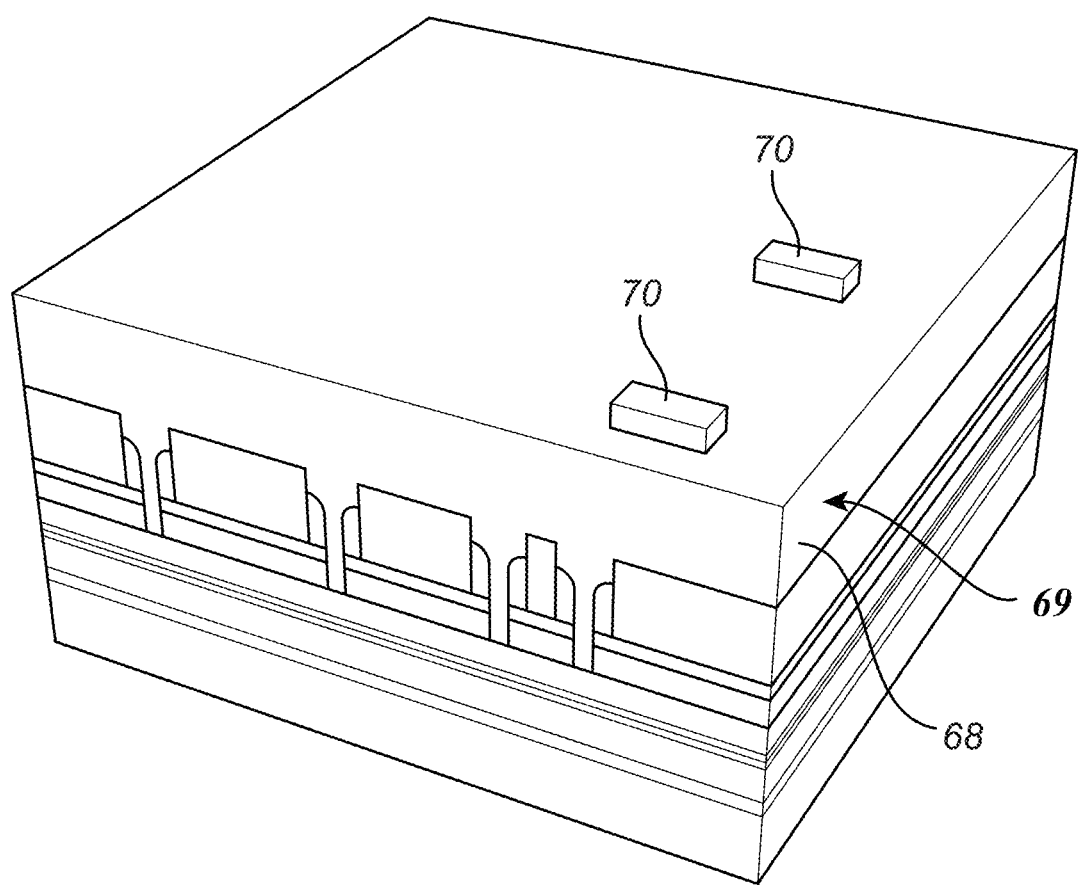
Figure 17:
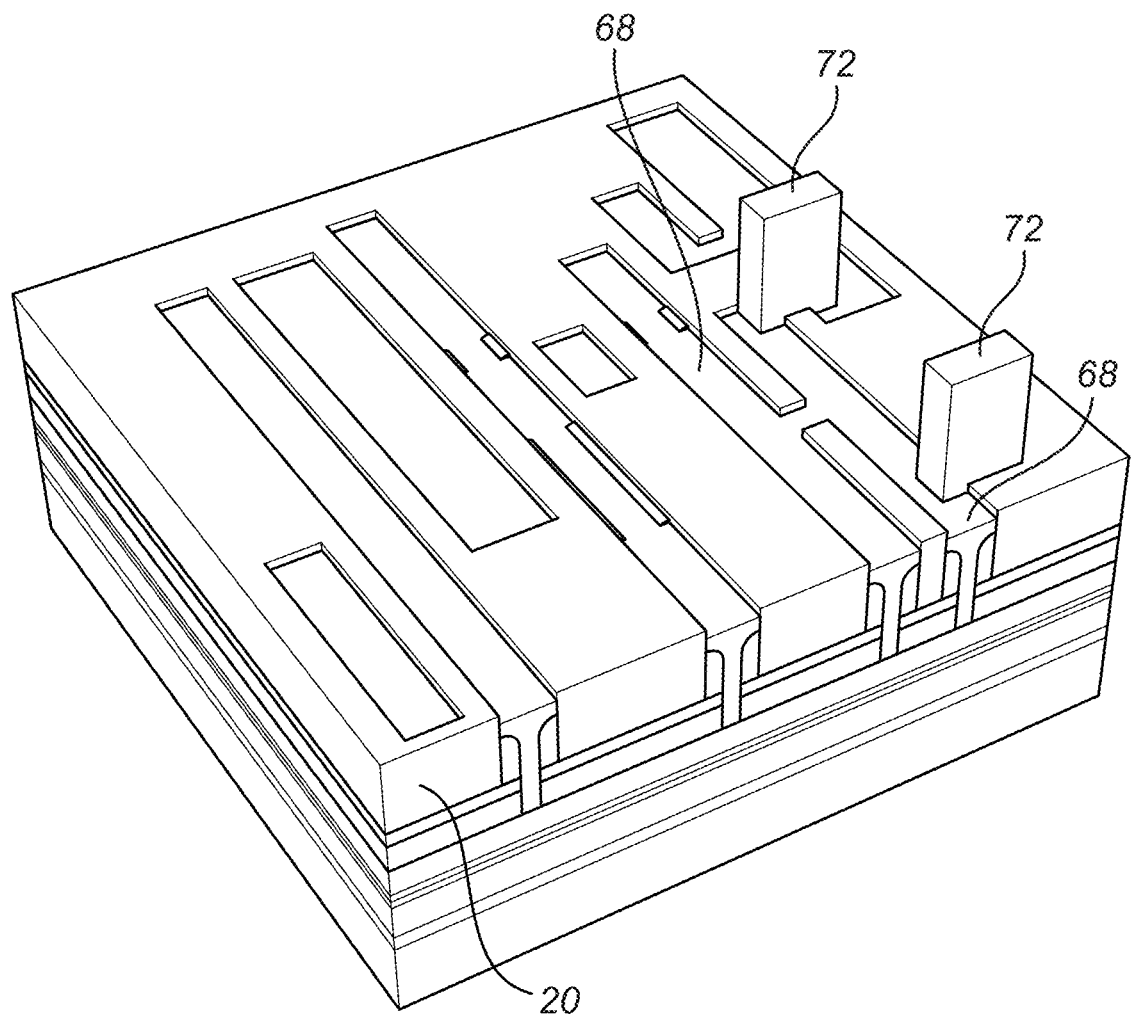
Figure 18:
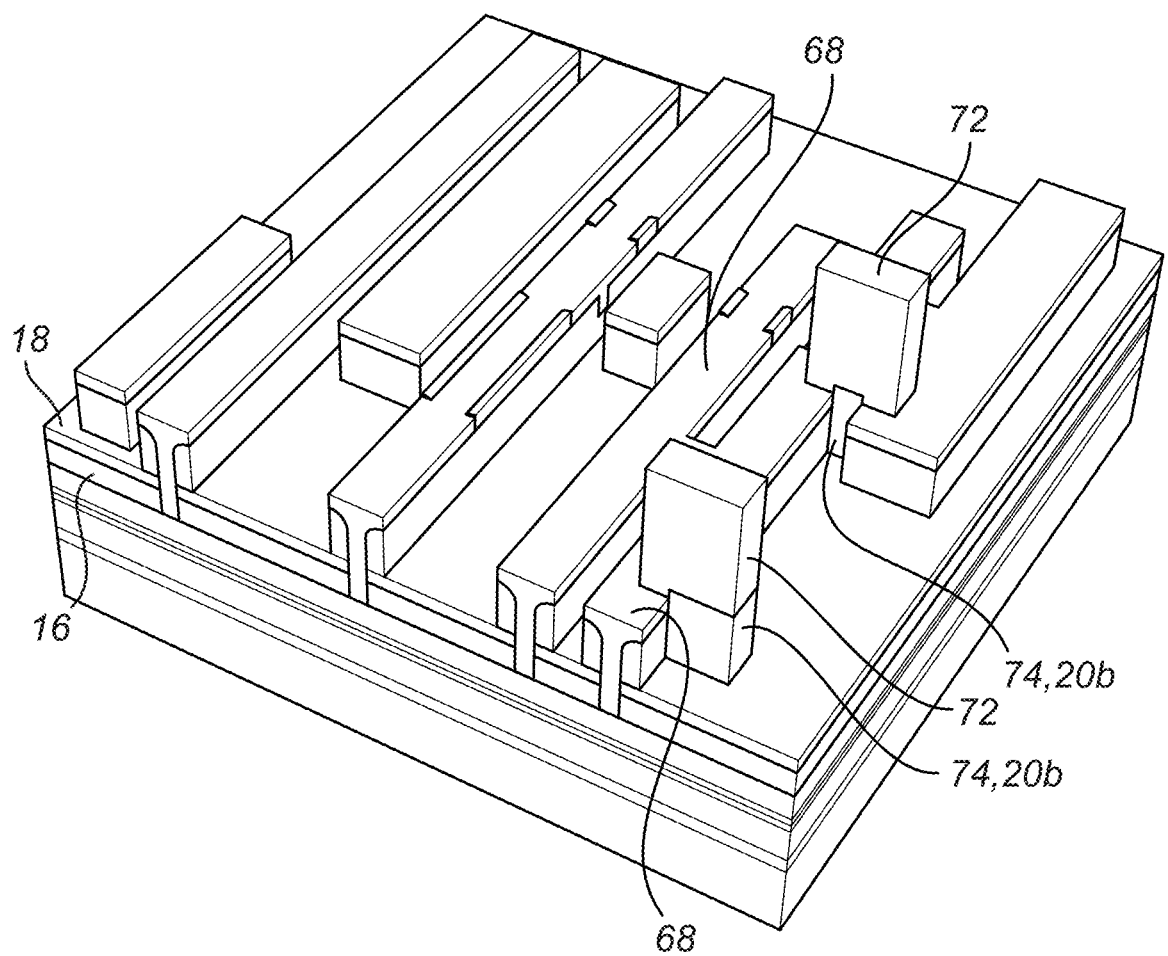

FIGS. 16-18 illustrate the patterning of the (already) patterned upper memorization layer 20 to form upper blocks 74. These process steps may follow after the above-described via opening patterning.

The upper blocks 74 are formed using lithography and etching. As shown in FIG. 16, an auxiliary block mask stack 69 comprising a mask material 68 and a resist layer forming resist blocks 70 is formed over the patterned upper memorization layer 20. The mask material 68 may fill the upper, the intermediate, and first lower trenches 30, 40, 42. The mask material 68 may form a planarizing layer covering the patterned upper memorization layer 20. The mask material 68 may be a SOC or other organic spin-on layer. Similar to the discussion of the via hole etch stacks 44, 56, additional mask materials (e.g., anti-reflective coatings) may be present in the auxiliary block mask stack 69.

The auxiliary block mask stack 69 may be patterned to form second mask blocks 72, as shown in FIG. 17, by lithographically patterning the resist blocks 70 in the resist layer and then etching the mask material 68 while the resist blocks 70 masks the mask material 68. During patterning of the auxiliary block mask stack 69 the mask material 68 may be etched back until an upper surface of the patterned upper memorization layer 20 is exposed. Mask material 68 may accordingly remain in the upper, the intermediate, and first lower trenches 30, 40, 42.

In FIG. 18, the patterned upper memorization layer 20 has been etched while the second mask blocks 72 mask the patterned upper memorization layer 20. Upper blocks 74 may thus be formed of respective remaining portions 20b of the patterned upper memorization layer 20. By etching the patterned upper memorization layer 20 using an etching process adapted to etch the upper memorization layer 20 at a greater rate than the mask material 68, the mask material 68 may fill the trenches 30, 40, 42 also subsequent to forming the upper blocks 74. Correspondingly, the second mask blocks 72 may remain on the upper blocks 74. For example, the patterning of the patterned upper memorization layer 20 may comprise using an "a-Si etch," as discussed above.

Figure 19:
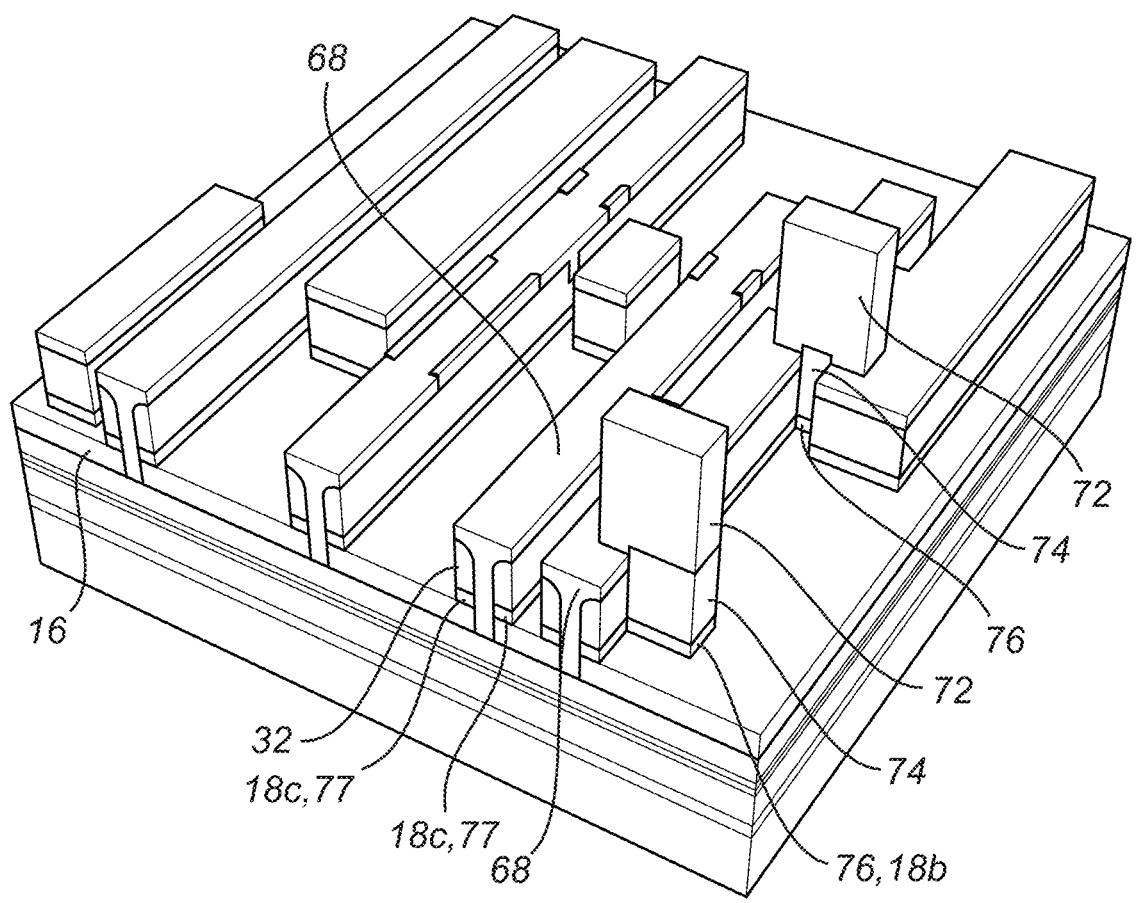

In FIG. 19, the (already) patterned intermediate memorization layer 18 has been patterned to form second intermediate blocks 76 and intermediate lines 77. The patterning may comprise etching while the spacer lines 32 and the upper blocks 74 mask the patterned intermediate memorization layer 18.

The second intermediate blocks 76 may be formed of intermediate memorization layer portions 18b masked by the upper blocks 74. The intermediate lines 77 may be formed by intermediate memorization layer portions 18c masked by the spacer lines 32. During the etching, the mask material 68 may mask the first intermediate blocks 19, such that the first intermediate blocks 19 and the first lower blocks 21 underneath may be preserved. The intermediate memorization layer 18 may be etched, e.g., by RIE using a fluorine-based etchant.

After the patterning of the patterned intermediate memorization layer 18, the upper blocks 74 and the spacer lines 32 have accordingly been "memorized" in the patterned intermediate memorization layer 18 as second intermediate blocks 76 and intermediate lines 77, respectively.

Figure 20:
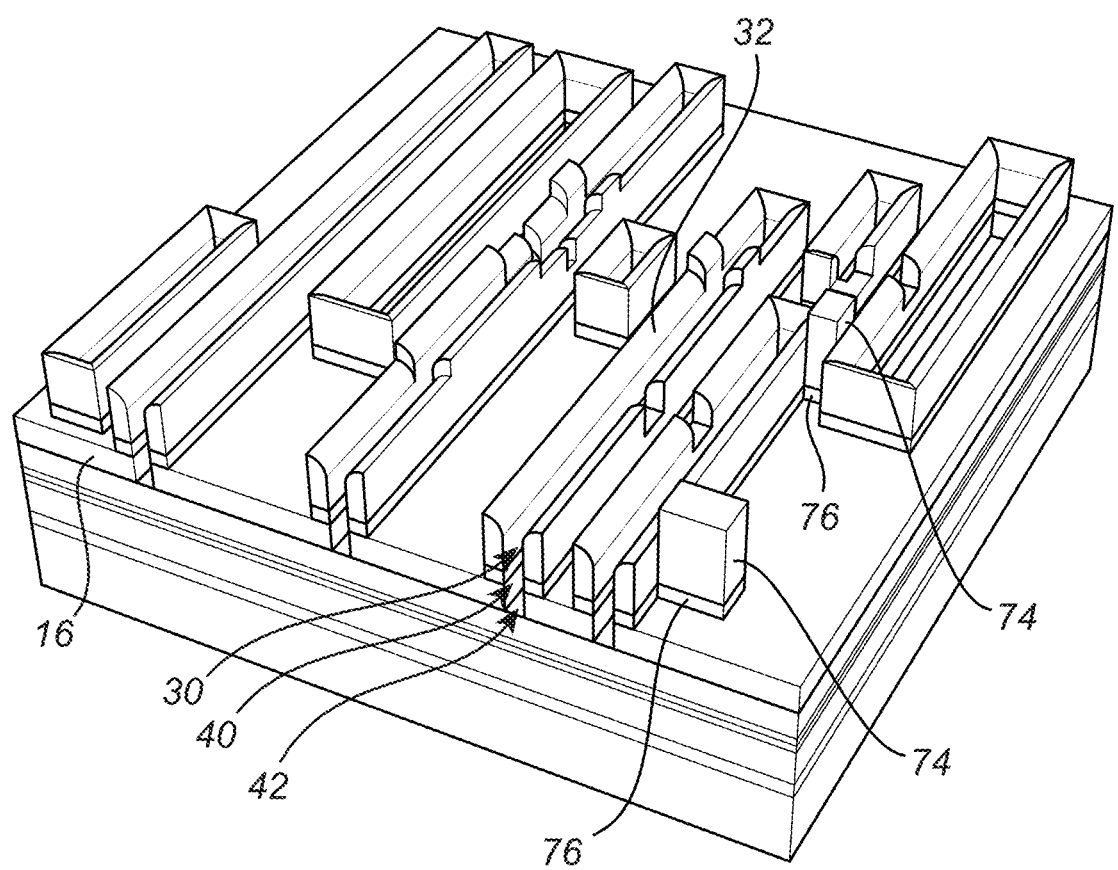

After patterning the patterned intermediate memorization layer 18, the mask material 68 (filling the trenches 30, 40, 42 and forming the second mask blocks 72) may, as shown in FIG. 20, be removed to reveal the trenches 30, 40, 42 and the upper blocks 74, for instance, using a SOC etch.

FIGS. 21-24 illustrate the patterning of the (already) patterned lower memorization layer 16 to form second lower trenches 88 therein.

Figure 21:
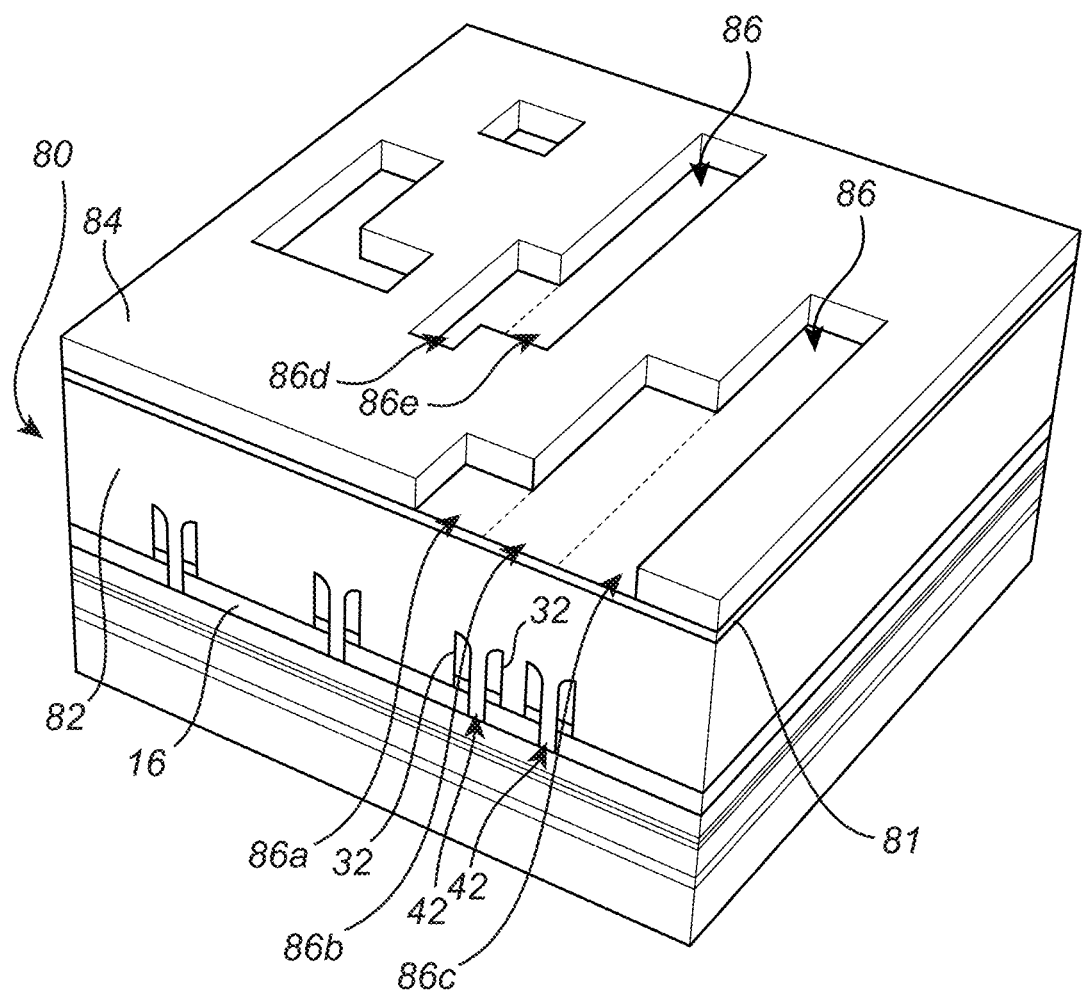

The second lower trenches 88 are formed by lithography and etching. As shown in FIG. 21, a (second) auxiliary trench mask stack 80 comprising a mask material 82 and a resist layer 84 over the mask material 82 is formed over the patterned lower memorization layer 16. The mask material 82 may fill the first lower trenches 42. The mask material 82 may further cover the upper blocks 74, which still may be present above the second intermediate blocks 76. The mask material 82 may form a planarizing layer. The mask material 82 may be a SOC or other organic spin-on material. Similar to the discussion of the auxiliary trench mask stack 22, additional mask materials (e.g., an anti-reflective coating 81) may be present in the auxiliary block mask stack 80.

Figure 22:
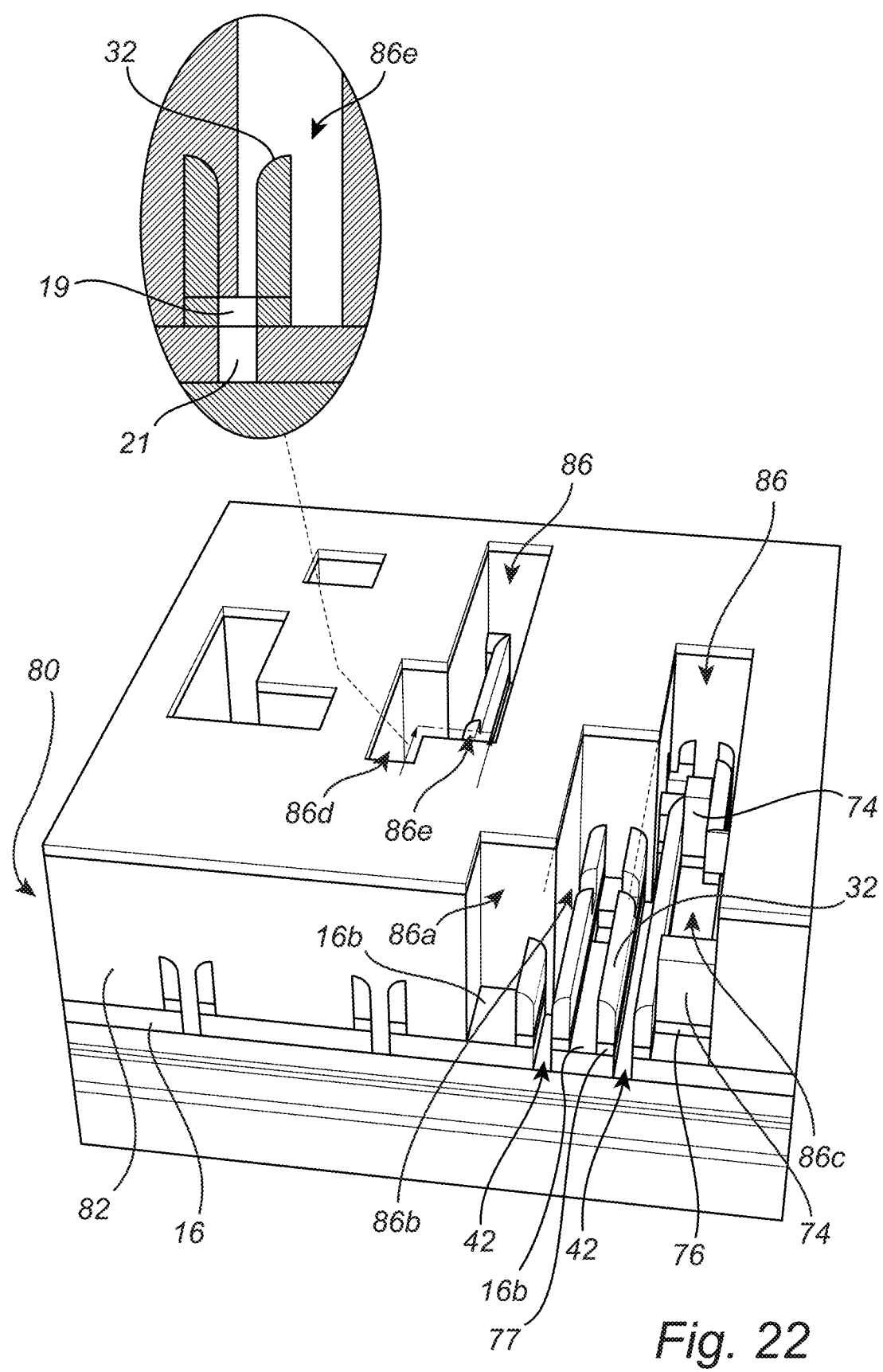

The auxiliary trench mask stack 80 may be patterned to form auxiliary trenches 86 by lithographically patterning auxiliary trenches 86 in the resist layer 84, as shown in FIG. 21, and then transferring the auxiliary trenches 86 into the mask material 82 by etching through the auxiliary trenches 86 in the resist layer 84, as shown in FIG. 22. During patterning of the auxiliary trench mask stack 80 the mask material 82 may be etched back at least until an upper surface 16b of the patterned lower memorization layer 16 is exposed, or further until an upper surface of the target memorization layer 12 is exposed. The auxiliary trenches 86 may expose and extend across upper blocks 74 and second intermediate blocks 76 underneath.

Figure 23:
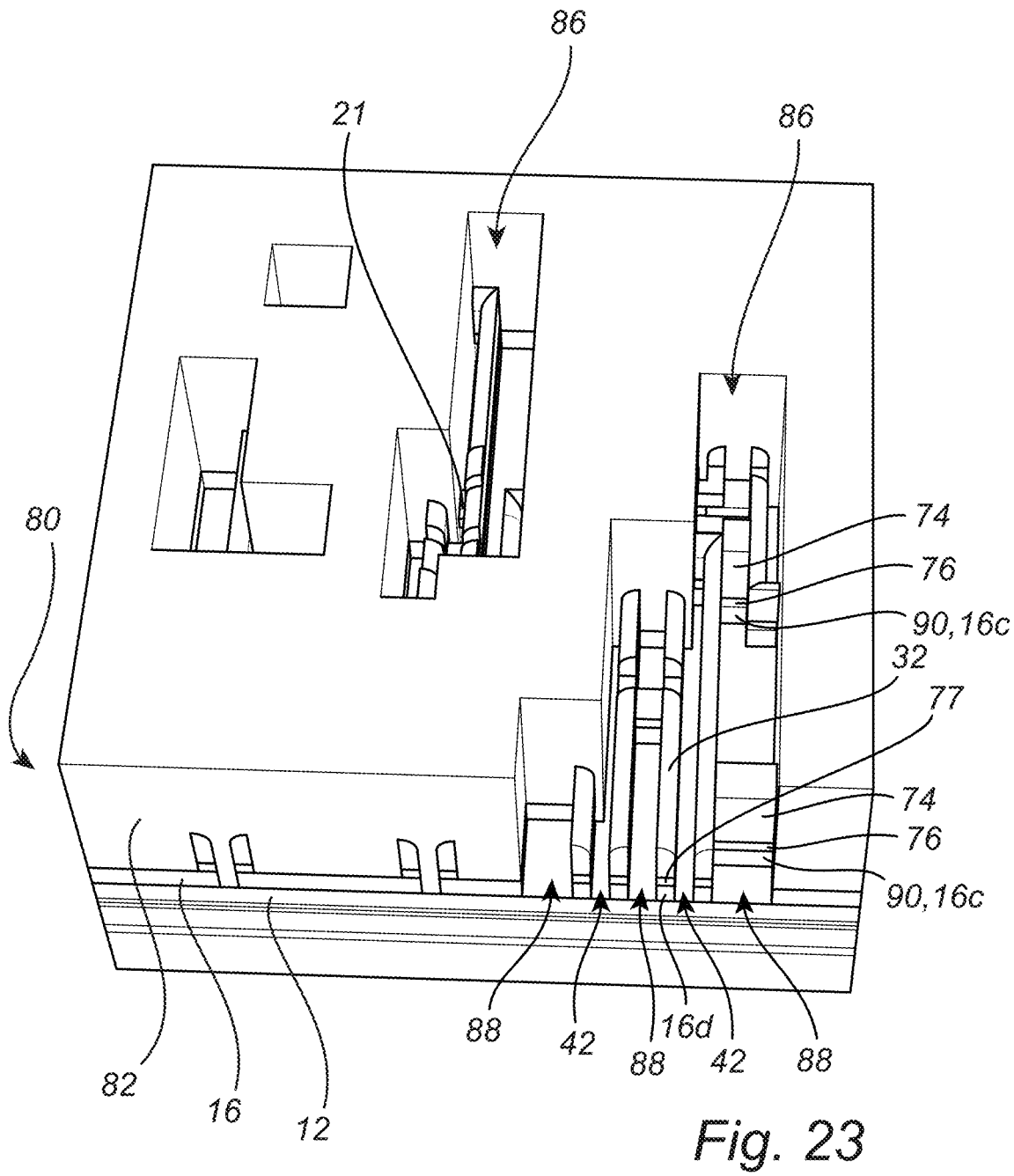

In FIG. 23, the patterned lower memorization layer 16 has been etched while the patterned auxiliary trench mask stack 80, the second intermediate blocks 76, and the intermediate lines 77 mask the patterned lower memorization layer 16, thereby forming the second lower trenches 88. In other words, the patterning may comprise etching back upper surface portions of the patterned lower memorization layer 16 exposed in the auxiliary trenches 86 (i.e., which are not masked by the second intermediate blocks 76 and the intermediate lines 77).

At each position in the patterned lower memorization layer 16 underneath an upper block 74 and a second intermediate block 76, a respective second lower block 90 has been formed by a respective second lower memorization layer portion 16c masked during the etching. Hence, at least a subset of the second lower trenches 88 may be interrupted by a respective second lower block 90.

The patterning of the patterned lower memorization layer 16 may comprise a selective etching of the patterned lower memorization layer 16 (i.e., using an etching process adapted to etch the patterned lower memorization layer 16 at a greater rate than the patterned intermediate memorization layer 18). As may be appreciated, an etching process etching the patterned lower memorization layer 16 at a greater rate than, not only the intermediate memorization layer 18, but also the upper blocks 74 and/or the spacer lines 32 may further improve the etch mask budget. However, if already the intermediate memorization layer 18 alone provides a sufficient etch mask budget, it is possible to remove the upper blocks 74 and/or spacer lines 32 prior to patterning the second lower trenches 88.

For example, SiN may be etched selectively to TiN (as well as SOC, $SiO_2$ and a-Si) by RIE using, e.g., a fluorine-based chemistry (e.g., $CHF_3$, $CH_3F$, $C_4F_8$, $CF_4$, $CH_2F_2$), optionally using a continuous wave plasma, plasma pulsing or a cycling process (e.g., Quasi-Atomic Layer etching). However, other etching processes allowing a sufficiently selective etching of the lower layer material with respect to (at least) the intermediate layer material may also be used.

Reference signs 86a-c and 86d-e in FIGS. 21 and 22 indicate relaxed CD auxiliary trenches extending above/overlapping not only remaining portions of the lower memorization layer 16 in which the second lower trenches 88 are to be formed, but also one or more first lower trenches 42. The auxiliary trenches 86 may accordingly also extend above a first intermediate block 19 and a first lower block 21, as shown in the enlarged view inset of FIG. 22 along the auxiliary trench 86e. By the presence of the first intermediate blocks 19, each first lower blocks 21 exposed in the auxiliary trenches 86 may accordingly be masked during the selective etching of the patterned lower memorization layer 16 and hence preserved after the formation of the second lower trenches 88 is complete. Moreover, the intermediate lines 77 (and spacer lines 32) allow a minimum spacing between the first and second lower trenches 42, 88 to be ensured.

Figure 24:
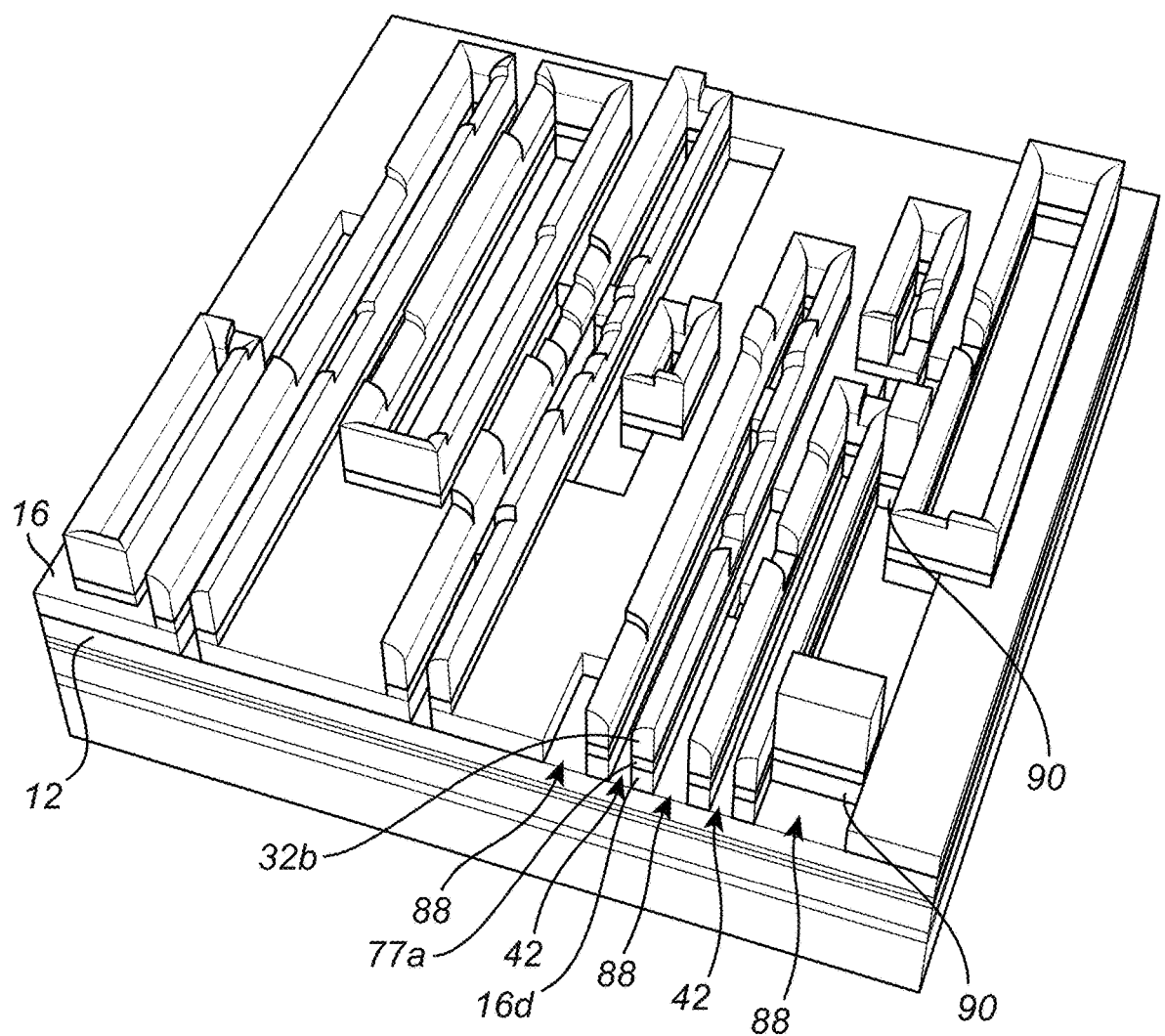

In FIG. 24, the patterned auxiliary trench mask stack 80 has been removed from the structure (e.g., using an SOC etch), thus revealing the (twice) patterned lower memorization layer 16 with the first and second lower trenches 42, 88 formed therein. The second lower trenches 88 may be arranged alternatingly with the first lower trenches 42. As further shown, one or more second lower trenches 88 may be spaced from an adjacent first trench 42 by only a lower line formed by a (wall-shaped) portion 16d of the patterned lower memorization layer 16 preserved under a spacer layer portion 32b and an intermediate line portion 77a. The line width of this lower line 16d matches or at least corresponds to a line width of the spacer line portion 32b.

Figure 25:
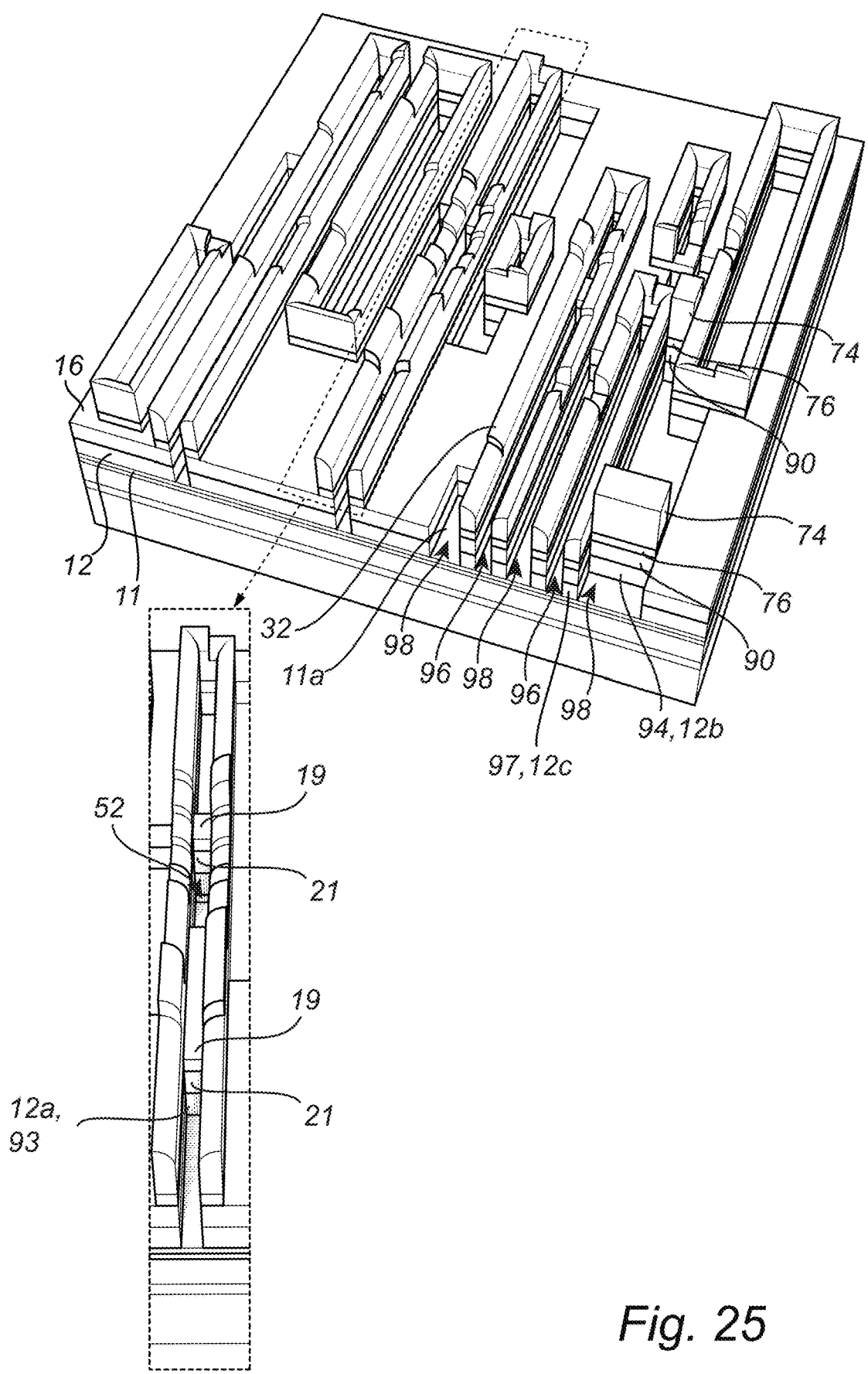

In FIG. 25, the target memorization layer 12 has been patterned to form a first set of "target" trenches 96 underneath the first lower trenches 42 and a second set of "target" trenches 98 underneath the second lower trenches 88. The patterning of the target memorization layer 12 may comprise etching the target memorization layer 12 while the (twice) patterned lower memorization layer 16 masks the target memorization layer 12. In other words, the first set of trenches 96 may be formed by etching back the target memorization layer 12 through the first lower trenches 42 and the second set of trenches 98 may be formed by etching back the target memorization layer 12 through the second lower trenches 98. A bottom surface of the trenches 96, 98 may be formed by an upper surface of the interfacial layer(s) 11 or the insulating layer 10.

Underneath each first lower block 21, a first target block 93 has been formed by a respective first target memorization layer portion 12a masked by the first lower block 21 during the etching of the target memorization layer 12. Hence, a respective first target memorization layer portion 12a may be preserved underneath each first lower block 21. Accordingly, at least a subset of the first target trenches 96 are interrupted by a respective first target block 93.

Underneath each second lower block 90, a second target block 94 has been formed by a respective second target memorization layer portion 12b masked by the second lower block 90 during the etching of the target memorization layer 12. Hence, a respective second target memorization layer portion 12b may be preserved underneath each second lower block 90. Accordingly, at least a subset of the second target trenches 98 are interrupted by a respective second target block 94.

A second target trench 98 may, as shown, be spaced from an adjacent first target trench 96 by (only) a lower line 97 formed of a third target memorization layer portion 12c masked by a respective lower line 16d during the etching.

In FIG. 25, the target memorization layer 12 is masked also by intermediate lines 77, the first and second intermediate blocks 19, 76, the upper blocks 74, and the spacer lines 32. This may provide an increased mask budget during the patterning of the target memorization layer 12. However, it is possible that one or more of these features have been removed prior to the patterning of the target memorization layer 12.

Figure 26:
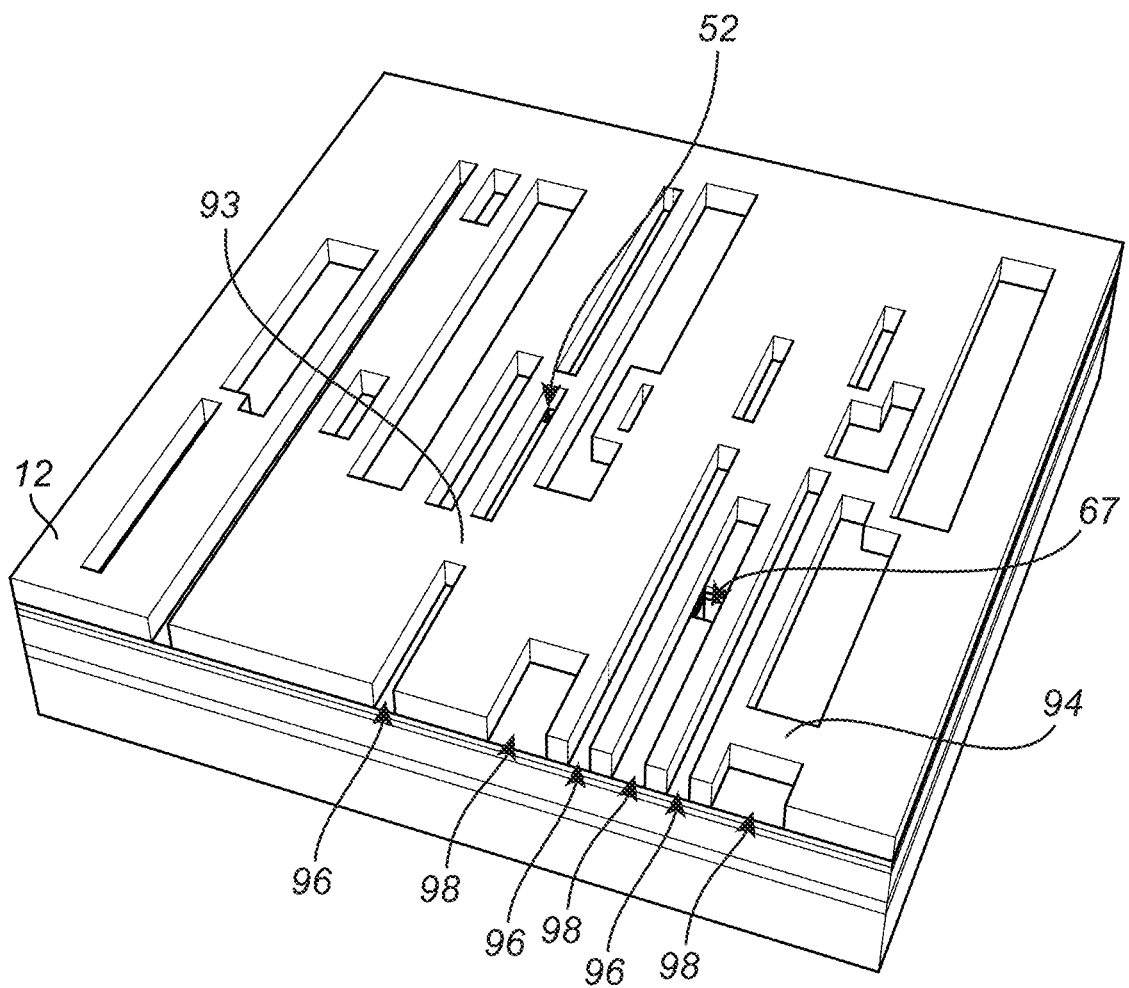

Subsequent to patterning the target memorization layer 12, the patterned lower memorization layer 16, the intermediate lines 77, the first and second intermediate blocks 19, 76, the upper blocks 74, and the spacer lines 32 may be removed from the patterned target memorization layer 12. A resulting structure is shown in FIG. 26.

Figure 27A:
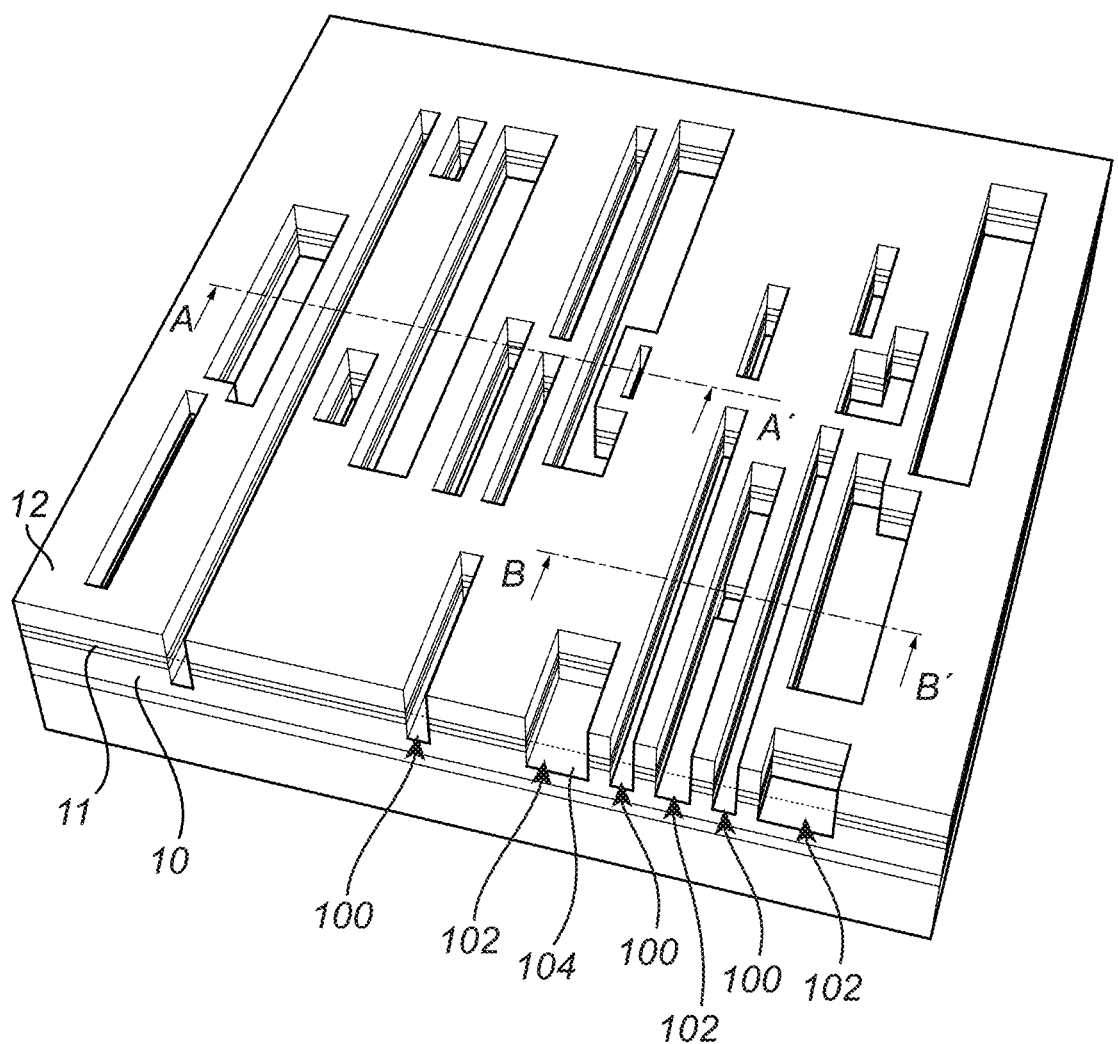
FIG. 27a illustrates a view of the structure with various sections, in accordance with an example embodiment.
Figure 27B:
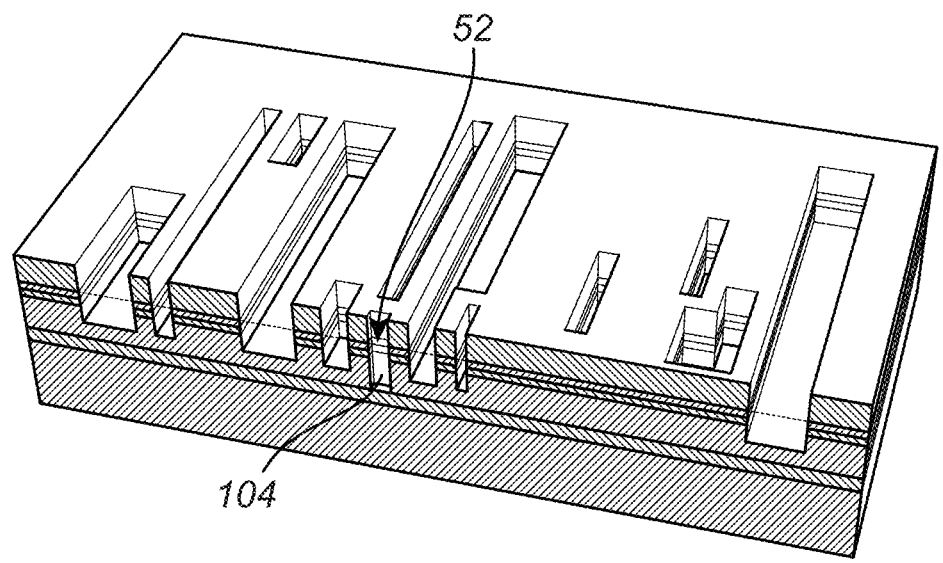
FIGS. 27b and 27c illustrate cross-sections of the structure along section A-A' and B-B', respectively, in accordance with an example embodiment.
Figure 27C:
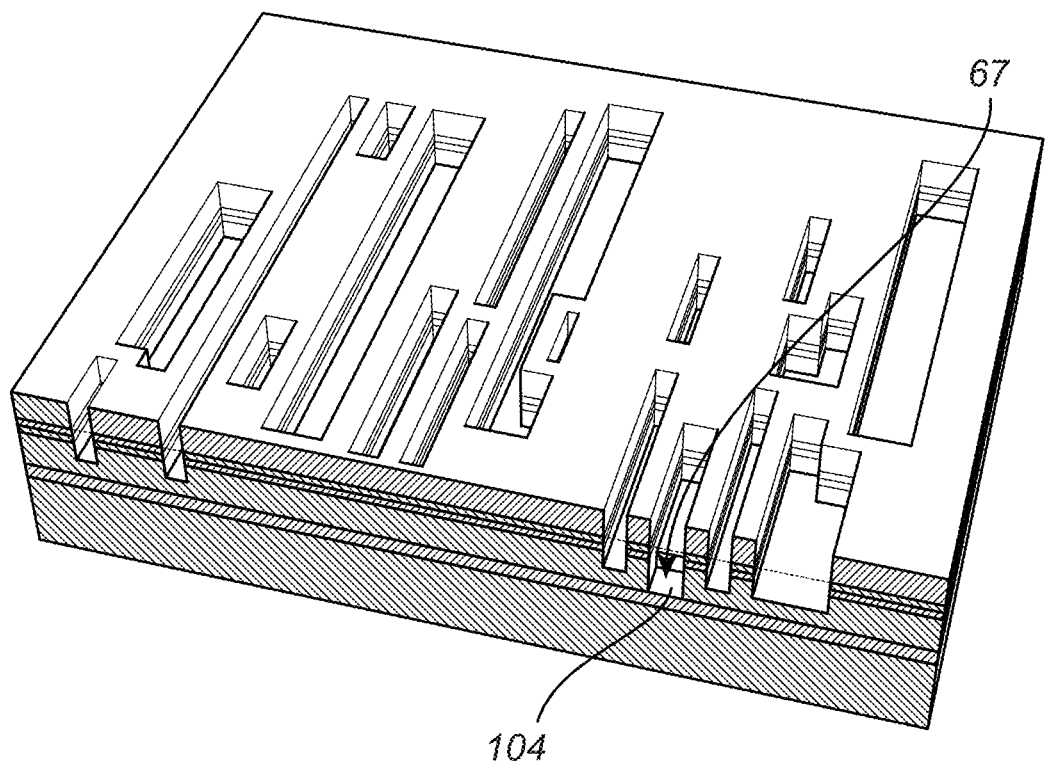

FIGS. 27b and 27c show respective cross-sections of the structure taken along lines A-A' and B-B', respectively, indicated in FIG. 27a. Trenches have been etched in the insulating layer 10 and interfacial layer(s) 11 while the patterned target memorization layer 12 masks the insulating layer 10, thereby forming first insulating layer trenches 100 underneath the first set of target trenches 96 and second insulating layer trenches 102 underneath the second set of target trenches 98. Hence, the trench pattern defined in the target memorization layer 12 has been transferred into the insulating layer 10, including any interrupted trenches. As may be seen in the cross-sectional views of FIG. 27b, 27c, the etching of the trenches in the insulating layer may simultaneously result in final deepened via openings 52, 67, similar to a dual damascene process.

As further schematically indicated, the trenches and via openings in the insulating layer 10 may be filled with a conductive material 104. As may be appreciated, the conductive material 104 may, however, be deposited first after removing the target memorization layer 12, The conductive material 106 may be one or more metals conventionally used to form metal lines and vias in BEOL processing, such as W, Cu, Al, Ru to provide a few non-limiting examples.

While certain examples are described above, it will be readily appreciated by a person skilled in the art that examples other than the ones disclosed above are equally possible within the scope of the claims.

For example, the method may proceed with depositing a further insulating layer over the insulating layer 10 and the metal lines and vias therein. The above method steps may thereafter be repeated to form a further higher interconnection level. This may be repeated until a desired number of interconnection levels have been formed.

Moreover, in the above process flow, the first set of trenches 96 and the second set of trenches 98 are patterned simultaneously in the target memorization layer 12. However, a sequential approach is also possible wherein the first set of trenches 96 are patterned in the target memorization layer 12 prior to patterning the second set of trenches 98 in the target memorization layer 12. According to a sequential approach, the first set of trenches 96 may, for example, be formed subsequent to forming the first lower trenches 42 and prior to patterning the patterned upper memorization layer 20 to form the upper blocks 30. The second set of trenches 98 may be formed subsequent to forming the second lower trenches 88 in the patterned lower memorization layer 16. If vias are to be formed in a first and/or second via formation process as described above, the first set of trenches 96 may, for example, be formed in the target memorization layer 12 prior to the via formation process(es).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A patterning method comprising:
   forming, over an underlying layer, a layer stack comprising a lower, an intermediate, and an upper memorization layer;
   patterning the upper memorization layer using lithography and etching to form upper trenches in the upper memorization layer;
   forming sidewall spacer lines along sidewalls of the upper trenches;
   forming first mask blocks, wherein each first mask block forms a trench interruption along a respective upper trench of the upper trenches;
   patterning the intermediate memorization layer and the lower memorization layer to form intermediate trenches in the intermediate memorization layer and first lower trenches in the lower memorization layer, the patterning comprising etching while the patterned upper memorization layer, the sidewall spacer lines, and the first mask blocks mask the intermediate memorization layer, wherein at least a subset of the intermediate trenches are interrupted by a respective first intermediate block formed of a respective first intermediate memorization layer portion masked by a respective first mask block, and wherein at least a subset of the first lower trenches are interrupted by a respective first lower block formed of a respective first lower memorization layer portion masked by the respective first intermediate block;
   while a deposited mask material is filling the upper, the intermediate, and the first lower trenches:
      patterning the patterned upper memorization layer using lithography and etching to form upper blocks of remaining upper memorization layer portions; and
      patterning the patterned intermediate memorization layer to form second intermediate blocks and intermediate lines, the patterning comprising etching while the spacer lines and the upper blocks mask the patterned intermediate memorization layer, and the deposited mask material masks the first intermediate blocks, wherein the second intermediate blocks are formed of intermediate memorization layer portions masked by the upper blocks, and the intermediate lines are formed by intermediate memorization layer portions masked by the spacer lines;
   patterning the patterned lower memorization layer to form second lower trenches in the patterned lower memorization layer, the patterning comprising:
      forming an auxiliary trench mask stack over the lower memorization layer and patterning auxiliary trenches therein by lithography and etching to thereby provide a patterned auxiliary trench mask stack; and
      etching the patterned lower memorization layer, while the patterned auxiliary trench mask stack, the second intermediate blocks, and the intermediate lines mask the patterned lower memorization layer, and the first intermediate blocks mask the first lower blocks, wherein at least a subset of the second lower trenches are interrupted by a respective second lower block formed of a respective second lower memorization layer portion masked by a respective second intermediate block of the second intermediate blocks; and
   patterning, in the underlying layer, a first set of trenches underneath the first lower trenches and a second set of trenches underneath the second lower trenches.

2. The method according to claim 1, further comprising:
   subsequent to forming the first lower trenches, forming an auxiliary block mask stack comprising the mask material filling the upper, the intermediate, and the first lower trenches; and a resist layer;
   wherein the patterning of the patterned upper memorization layer comprises patterning the auxiliary block mask stack to form auxiliary blocks using lithography and etching, and subsequently patterning the patterned upper memorization layer using the patterned auxiliary block mask stack to form the upper blocks.

3. The method according to claim 2, wherein the auxiliary trench mask stack comprises the mask material that forms a planarizing layer that covers the upper blocks, the spacer lines, and the patterned lower memorization layer; and
   the resist layer.

4. The method according to claim 3, wherein at least one of the auxiliary trenches extends above a first lower trench of the first lower trenches and the first intermediate block above the first lower block located in the first lower trench.

5. The method according to claim 4, wherein trenches of at least the subset of the second lower trenches are arranged alternatingly with trenches of at least a subset of the first set of trenches underneath the first lower trenches.

6. The method according to claim 5, wherein a trench of the at least the subset of the second lower trenches is spaced from an adjacent trench of the at least the subset of the first lower trenches by a respective lower line formed of a respective third lower memorization layer portion masked by a respective intermediate line of the intermediate lines.

7. The method according to claim 6, wherein the mask material comprises an organic spin-on material.

8. A method for forming an interconnection structure, comprising:
   forming over an insulating layer a target memorization layer;
   forming a first and a second set of trenches in the target memorization layer in accordance with the method according to claim 7, wherein the underlying layer is the target memorization layer;
   subsequent to forming the first and second set of trenches in the target memorization layer, etching trenches in the insulating layer while the target memorization layer masks the insulating layer; and depositing a conductive material in the trenches in the insulating layer.

9. The method according to claim 8, further comprising:
subsequent to the patterning of the intermediate and lower memorization layers and prior to the patterning of the patterned upper memorization layer:
forming a via hole etch stack comprising the mask material filling the upper, the intermediate, and first lower trenches, and further comprising the resist layer;
forming an opening in the via hole etch stack, the opening exposing an upper surface of a remaining portion of the patterned upper memorization layer;
etching back the exposed upper surface of the patterned upper memorization layer to form an opening in the patterned upper memorization layer; and
sequentially etching back the patterned intermediate, patterned lower, and target memorization layers through the opening in the patterned upper memorization layer to form an extended opening therethrough; and
etching the insulating layer through the extended opening.

10. The method according to claim 9, wherein the etching back of the exposed upper surface of the patterned upper memorization layer etches the patterned upper memorization layer at a greater rate than the mask material filling the upper trenches or at a greater rate than the spacer lines.

11. The method according to claim 10, wherein the exposed upper surface of the upper memorization layer is located between a pair of upper trenches, and wherein a width of the opening in the via hole etch stack exceeds a spacing between the pair of upper trenches.

12. The method according to claim 11, further comprising:
subsequent to the patterning of the intermediate and lower memorization layers and prior to the patterning of the patterned upper memorization layer:
forming the via hole etch stack comprising a the mask material filling the lower, the intermediate, and the upper trenches, and further comprising the resist layer);
forming the opening in the via hole etch stack, the opening exposing a bottom surface of one of the first lower trenches, the opening exposing spacer layer portions on opposite sides of the first lower trench;
etching back the exposed bottom surface to form an opening in the target memorization layer; and
etching the insulating layer through the opening in the target memorization layer.

13. The method according to claim 12, wherein forming the opening in the via hole etch stack comprises etching the mask material filling the trenches at a greater rate than the spacer layer.

14. The method according to claim 9, wherein the exposed upper surface of the upper memorization layer is located between a pair of upper trenches, and wherein a width of the opening in the via hole etch stack exceeds a spacing between the pair of upper trenches.

15. The method according to claim 8, further comprising:
subsequent to the patterning of the intermediate and lower memorization layers and prior to the patterning of the patterned upper memorization layer:
forming a via hole etch stack comprising the mask material filling the lower, the intermediate, and the upper trenches, and further comprising the resist layer;
forming an opening in the via hole etch stack, the opening exposing a bottom surface of one of the first lower trenches, the opening exposing spacer layer portions on opposite sides of the first lower trench;
etching back the exposed bottom surface to form an opening in the target memorization layer; and
etching the insulating layer through the opening in the target memorization layer.

16. The method according to claim 1, wherein the auxiliary trench mask stack comprises the mask material that forms a planarizing layer covering the upper blocks, the spacer lines, and the patterned lower memorization layer; and a resist layer.

17. The method according to claim 1, wherein at least one of the auxiliary trenches extends above one of the first lower trenches and one of the first intermediate blocks above one of the first lower blocks located in the first lower trench.

18. The method according to claim 1, wherein trenches of at least the subset of the second lower trenches are arranged alternatingly with trenches of at least a subset of the first set of trenches underneath the first lower trenches.

19. The method according to claim 1, wherein the mask material comprises an organic spin-on material.

20. A method for forming an interconnection structure, comprising:
forming over an insulating layer a target memorization layer;
forming the first and the second set of trenches in the target memorization layer in accordance with the method according to claim 1, wherein the underlying layer is the target memorization layer;
subsequent to forming the first and second set of trenches in the target memorization layer, etching trenches in the insulating layer while the target memorization layer masks the insulating layer; and
depositing a conductive material in the trenches in the insulating layer.

* * * * *